(12) United States Patent
Kobata et al.

(10) Patent No.: US 7,888,974 B2
(45) Date of Patent: Feb. 15, 2011

(54) FREQUENCY SYNTHESIZER

(75) Inventors: Tsukasa Kobata, Sayama (JP);
Tsuyoshi Shiobara, Sayama (JP);
Kazuo Akaike, Sayama (JP); Nobuo Tsukamoto, Akishima (JP)

(73) Assignee: Nihon Dempa Kogyo Co. . Ltd., Tokyo (JP)

( * ) Notice: Subject to any disclaimer, the term of this patent is extended or adjusted under 35 U.S.C. 154(b) by 0 days.

(21) Appl. No.: 12/803,294

(22) Filed: Jun. 23, 2010

(65) Prior Publication Data

US 2010/0321068 A1    Dec. 23, 2010

Related U.S. Application Data

(62) Division of application No. 12/225,563, filed as application No. PCT/JP2007/055774 on Mar. 14, 2007, now Pat. No. 7,825,701.

(30) Foreign Application Priority Data

Mar. 31, 2006    (JP)    ............................. 2006-100935

(51) Int. Cl.
*H03L 7/085*    (2006.01)
*H03L 7/08*    (2006.01)
(52) U.S. Cl. ........................ 327/105; 331/34; 331/25; 331/182
(58) Field of Classification Search ................ 327/105, 327/107, 156, 159; 331/34, 25, 182
See application file for complete search history.

(56) References Cited

U.S. PATENT DOCUMENTS 5,537,449 A    7/1996    Nezu 7,054,403 B2    5/2006    Nosaka et al.
7,764,207 B2 *    7/2010    Kobata et al. ............... 341/110
2009/0021312 A1 *    1/2009    Kimura et al. ............... 331/34

FOREIGN PATENT DOCUMENTS

| JP | 4-101515 | 4/1992 |
|---|---|---|
| JP | 7-086925 | 3/1995 |
| JP | 8-018446 | 1/1996 |
| JP | 2002-084189 | 3/2002 |
| JP | 2004-274673 | 9/2004 |

* cited by examiner

*Primary Examiner*—Daniel D Chang
(74) *Attorney, Agent, or Firm*—Jordan and Hamburg LLP

(57) ABSTRACT

An object of the present invention provides a frequency synthesizer having a broad frequency entraining range which can finely set a frequency over a broad band by a novel principle.

As a specific solving means, a sinusoidal signal of an output frequency of a voltage-controlled oscillator is subjected to orthogonal detection, a vector rotating at the differential frequency (speed) between the output frequency and the frequency of the frequency signal used for the detection is created, and the frequency of a vector when the output frequency of the voltage-controlled oscillator is equal to a set value is calculated in advance. The voltage signal corresponding to the difference between the frequency of the vector and the calculated frequency is fed back to the voltage-controlled oscillator when the voltage-controlled oscillator is driven, and PLL is formed so that the difference is equal to zero. Accordingly, the output frequency of the voltage-controlled oscillator is adjusted to the set frequency when PLL is locked. After the difference between both the frequencies is increased after PLL is locked, the set value is integrated by the integrating circuit portion and added to the control voltage.

7 Claims, 12 Drawing Sheets

FREQUENCY SYNTHESIZER

REFERENCE TO RELATED APPLICATION

This is a divisional application of Ser. No. 12/225,563, filed Oct. 27, 2008, which is in turn, currently pending. The subject matter of the aforementioned prior application is hereby incorporated herein by reference.

TECHNICAL FIELD

The present invention relates to a frequency synthesizer for obtaining an oscillation output having a desired frequency.

BACKGROUND ART

A frequency synthesizer to which PLL (Phase Locked Loop) is applied as one of standard signal generators is known. As shown in FIG. 12, in the frequency synthesizer, a voltage-controlled oscillator 201 is subjected to 1/N frequency division by a frequency divider 202 and the frequency-division output is input to one input terminal of a phase comparator 203. In addition, an oscillation output of a crystal oscillator 204 as a reference signal generator is subjected to 1/M frequency-division by a frequency divider 200 and the frequency-division output is input to the other input terminal of the phase comparator 203. The comparison signal therebetween is fed back to the voltage-controlled oscillator 201 through a loop filter 205, thereby constructing PLL for example, Patent Document 1). When PLL is locked, the frequency fvco of the oscillation output of the voltage-controlled oscillator 201 and the frequency f0 of the oscillation output of the crystal oscillator 204 satisfy the following relationship: fvco/N=f0/M, and thus fvco=(N/M)f0. The frequency divider 202 is constructed by a programmable counter, and the frequency division ratio N can be set on the basis of digital data from the external, so that the frequency of fvco can be freely set.

For example, the frequency synthesizer is applied as a station oscillating unit at a mobile station. That is, at a base station, a predetermined frequency band is allocated to a mobile station. Therefore, it is necessary for the mobile station side to generate an oscillation output of the allocated frequency band, and thus it is required to bring the station oscillating unit with a function of adjusting the frequency. Furthermore, the frequency synthesizer is also used for a test signal source of radio communication equipment, broadcasting equipment or the like.

As described above, for example when the frequency synthesizer is applied in a communication field, it is required that noise is little to avoid cross talk with other channels. Furthermore, since electric waves are congested, it is desired that the frequency can be set as finely as possible. In order to set the frequency finely, the frequency division ratio N described above may be increased. However, if the frequency division ratio is excessively increased, noise becomes large due to elongation of a delay occurring in a loop, and actually the upper limit of N is equal to about 1000.

Therefore, for convenience of description, for example when a frequency synthesizer in which the frequency of about 1000 MHz can be adjusted every 1 Hz is designed, the apparatus of FIG. 12 must be designed in a multistage style. That is, when the upper limit of N is equal to 1000, by setting the frequency (M/f0) of a reference signal input to the phase comparator to 1 MHz, a frequency synthesizer of 1 MHz to 1000 MHz in which the frequency can be set every 1 MHz can be manufactured. Likewise, by setting the frequency of the reference signal to 1 kHz, a frequency synthesizer of 1 kHz to 1 MHz in which the frequency can be set every 1 kHz can be manufactured. Likewise, by setting the frequency of the reference signal to 1 Hz, a frequency synthesizer of 1 Hz to 1 kHz in which the frequency can be set every 1 Hz can be manufactured. By stepwise combining the respective frequency synthesizers, a frequency synthesizer in which the frequency can be set every 1 Hz until 1000 MHz can be obtained.

However, in this case, PLL must be constructed with respect to each synthesizing circuit for synthesizing frequencies, and thus there is a problem that the circuit construction is complicated, the number of parts is increased and noise is increased.

Therefore, the inventor of this application has developed a novel type frequency synthesizer which can finely set the frequency over a broad band by adopting a novel construction which is completely different from the conventional frequency synthesizers on principle, however, has run into trouble in that the frequency entraining range is narrow and the frequency entertainment cannot be surely performed in consideration of the dispersion of products of the voltage-controlled oscillation unit, the temperature characteristic, etc. Accordingly, the above problems must be overcome to put the frequency synthesizer concerned to practical use. Furthermore, this frequency synthesizer comprises analog circuits and digital circuits, and has a problem that noise caused by simultaneous switching of many switching elements in a digital/analog converter must be suppressed.

Patent Document 1

JP-A-2004-274673

DISCLOSURE OF THE INVENTION

The present invention has an object to provide a technique for a frequency synthesizer that can set frequencies finely over a broadband and obtain low-noise frequency signals and in which the frequency entraining range can be broadened, and also provide a technique that can suppress noise caused by simultaneous switching of many switching elements in a digital/analog converter by adopting a new architecture whose principal is completely different from the conventional frequency synthesizer.

A frequency synthesizer according to an invention comprises:

a voltage-controlled oscillation unit for oscillating a frequency signal having a frequency corresponding to a supplied voltage;

frequency-dividing means for subjecting the frequency signal to 1/N (N represents an integer) frequency division in accordance with a set frequency of the voltage-controlled oscillation unit;

an analog/digital converter for sampling a sinusoidal signal having the frequency corresponding to 1/N of the output frequency of the voltage-controlled oscillation unit on the basis of a reference clock signal and outputting a sampling value of the sampled sinusoidal signal as a digital signal;

vector extracting means for subjecting the frequency signal corresponding to the output signal from the analog/digital converter to orthogonal detection based on a digital signal of a sinusoidal signal having a frequency of $\omega 0/2\pi$, and extracting a real number part and an imaginary number part of a vector rotating at the frequency corresponding to the frequency difference between the frequency of the frequency signal concerned and $\omega 0/2\pi$ when the vector concerned is represented by complex notation;

a parameter output portion for calculating the frequency of the vector when the output frequency of the voltage-controlled oscillation unit is equal to a set value;

frequency difference extracting means for extracting the difference between the frequency of the vector and the frequency calculated by the parameter output portion;

means for integrating the voltage signal corresponding to the frequency difference extracted by the frequency difference extracting means and feeding back the integration value as a control voltage to the voltage-controlled oscillation unit through the digital/analog converter; and frequency entraining means for integrating a first constant by an integrating circuit portion to output a control voltage of the voltage-controlled oscillation unit while no voltage signal is obtained from the frequency difference extracting means because the output frequency from the voltage-controlled oscillation unit is excessively small at an operation start time of the apparatus, and integrating a second constant by the integrating circuit portion when PLL is locked and then the frequency difference between the set frequency and the output frequency from the voltage-controlled oscillation unit is out of a preset second range, and stopping the integrating operation of the integrating circuit portion after the frequency difference concerned is converged into a preset first range, wherein the control voltage of the voltage-controlled oscillation unit corresponds to the addition value of the control voltage from the feedback means and the control voltage from the frequency entraining means, and the PLL is constructed by the voltage-controlled oscillation unit, the vector extracting means and the means for feeding back the voltage signal to the voltage-controlled oscillation unit, and when the PLL is locked, the output frequency of the voltage-controlled oscillation unit is adjusted to the set frequency.

The first range is located in the second range, and narrower than the second range, for example. After the output frequency from the voltage-controlled oscillation unit increases and the voltage signal is obtained from the frequency difference extracting means because the first constant is integrated at the operation start time of the apparatus, the frequency entraining means integrates the frequency difference extracted by the frequency difference extracting means in place of the first constant, and outputs the control voltage of the voltage-controlled oscillation unit.

Furthermore, after the first constant is integrated by the integrating circuit portion to output the control voltage of the voltage-controlled oscillation unit and then a voltage signal is output from the frequency difference extracting means because the frequency difference between the set frequency and the output frequency from the voltage-controlled oscillation unit is reduced, in the frequency entraining means, the voltage signal concerned is integrated by the integrating circuit portion and converted to an analog signal at a frequency pitch larger than the feedback means, and the analog signal concerned is output as the control voltage of the voltage-controlled oscillation unit.

A frequency synthesizer according to another invention comprises:

a voltage-controlled oscillation unit for oscillating a frequency signal having a frequency corresponding to a supplied voltage;

frequency-dividing means for subjecting the frequency signal to 1/N (N represents an integer) frequency division in accordance with a set frequency of the voltage-controlled oscillation unit;

an analog/digital converter for sampling a sinusoidal signal having the frequency corresponding to 1/N of the output frequency of the voltage-controlled oscillation unit on the basis of a reference clock signal and outputting a sampling value of the sampled sinusoidal signal as a digital signal;

vector extracting means for subjecting the frequency signal corresponding to the output signal from the analog/digital converter to orthogonal detection based on a digital signal of a sinusoidal signal having a frequency of $\omega 0/2\pi$, and extracting a real number part and an imaginary number part of a vector rotating at the frequency corresponding to the frequency difference between the frequency of the frequency signal concerned and $\omega 0/2\pi$ when the vector concerned is represented by complex notation;

a parameter output portion for calculating the frequency of the vector when the output frequency of the voltage-controlled oscillation unit is equal to a set value;

frequency difference extracting means for extracting the difference between the frequency of the vector and the frequency calculated by the parameter output portion;

means for integrating the voltage signal corresponding to the frequency difference extracted by the frequency difference extracting means and feeding back the integration value as a control voltage to the voltage-controlled oscillation unit through the digital/analog converter; and frequency entraining means, wherein the frequency entraining means A) integrates a first constant by an integrating circuit portion and outputs the control voltage of the voltage-controlled oscillation unit while no voltage signal is obtained from the frequency difference extracting means because the output frequency of the voltage-controlled oscillation unit is excessively small and thus the frequency difference between the set frequency and the output frequency concerned is excessively large at an operation starting time of the apparatus, B) integrates a voltage signal from the frequency difference extracting means by the integrating circuit portion and converts the integrated voltage signal to an analog signal at a frequency pitch larger than the feedback means after the voltage signal is output from the frequency difference extracting means, and outputs the analog signal as the control voltage of the voltage-controlled oscillation unit, and C) stops the integrating operation of the integrating circuit portion after the frequency difference between the set frequency and the output frequency from the voltage-controlled oscillation unit is converged into a preset range, and sets the control voltage from the frequency entraining means as a fixed value, and D) in order to reduce glitch noise by reducing simultaneous switching of the digital/analog converter in the feedback means, the fixed value is set to a value which is displaced, by the amount corresponding to an integer multiple of an adjustable frequency pitch, from a control voltage whose output frequency is nearest to the set frequency among control voltages which can be set by the digital/analog converter in the frequency entraining means, PLL is constructed by the voltage-controlled oscillation unit, the vector extracting means and the feedback means for feeding back the voltage signal to the voltage-controlled oscillation unit, the output frequency of the voltage-controlled oscillation unit is adjusted to the set frequency when PLL is locked, and the control voltage of the voltage-controlled oscillation unit is equal to the addition value of the control voltage from the feedback means and the control voltage from the frequency entraining means.

The frequency dividing means contains a case of N=1. In this case, the frequency divider is not used in the actual apparatus, and an electrically conductive path between the output terminal of the voltage-controlled oscillation unit and the input terminal of the analog/digital converter corresponds to the frequency dividing means of the present invention. In the present invention, in order to make the description of Claims understandable easily, the construction of the frequency dividing means is described even in the case of N=1.

In order to set the control voltage of the voltage-controlled oscillation unit to the addition value of the control voltage from the feedback means and the control voltage from the frequency entraining means, a coupler for adding the control voltage from the feedback means and the control voltage from the frequency entraining means and supplying the addition result to the voltage-controlled oscillation unit is provided.

Or, the voltage-controlled oscillation unit may be provided with a port to which each of the control voltage from the feedback means and the control voltage from the frequency entraining means is input.

An example of a more specific embodiment of the present invention is equipped with a voltage output portion for outputting a voltage for driving the voltage-controlled oscillation unit, a voltage output portion for outputting a voltage for driving the voltage-controlled oscillation unit, and the means for feeding back the voltage signal to the voltage-controlled oscillation unit contains a loop filter having an integrating function provided at the subsequent stage to the frequency difference extracting means, and means for subtracting the output voltage of the loop filter from the output voltage of the voltage output portion and supplying the subtraction result to the voltage-controlled oscillation unit.

As a preferable embodiment of the present invention, for example, the parameter output portion calculates the value of N which provides the frequency nearest to the difference between the frequency of a reference clock signal used in the analog/digital converter and $\omega 0/2\pi$ used in the vector extracting means when the set value of the output frequency of the voltage-controlled oscillation unit is divided by N, and the frequency dividing means frequency-divides the frequency signal from the voltage-controlled oscillation unit by using this value.

As a preferable embodiment of the present invention, the parameter output portion calculates a frequency n·fa (n represents an integer) nearest to the frequency of the vector when the output frequency of the voltage-controlled oscillation unit is equal to the set value among frequencies of integer multiples of the frequency pitch fa for rough adjustment, and a frequency m·fb (m represents an integer) nearest to the difference between the frequency of the vector and the frequency n·fa when the output frequency of the voltage-controlled oscillation unit is equal to the set value among integer multiplies of a frequency pitch fb for minute adjustment which is smaller than the frequency pitch fa, and the frequency difference extracting means comprises means for multiplying the vector obtained in the vector extracting means by an inverse vector reversely rotating at the frequency n·fa to extract a slow speed vector whose frequency is obtained by subtracting the frequency of the inverse vector from the frequency of the vector, slow-speed detecting means for the slow-speed vector which determines the frequency of the slow-speed vector from the values of the real number part and the imaginary number part at each sampling time of the slow-speed vector concerned, and means for outputting a signal corresponding to the frequency of the slow-speed vector detected in the slow-speed detecting means and the frequency m·fb.

In this case, it is preferable that the frequency of the slow-speed vector is low to the extent that a phase θ on the complex plane representing a vector can be regarded as sin θ and the frequency concerned can be determined by an approximate calculation.

The slow-speed detecting means for the slow-speed vector may contain means for calculating the distance between a position on the complex plane determined by the real number part and the imaginary number part of a slow-speed vector at some sampling time and a position on the complex plane determined by the real number part and the imaginary number part at a next sampling time, and regarding the calculation value as the phase difference of the slow-speed vector at both the sampling times.

The means for feeding back the voltage signal corresponding to the frequency difference to the voltage-controlled oscillation unit contains means for accumulating a signal corresponding to the difference between the frequency of the slow-speed vector and the frequency m·fb, for example.

The inverse vector can be generated by a data table in which sets of real number parts and imaginary number parts defining the positions of inverse vectors on the complex plane are arranged in order along a rotational direction, and means for generating the address of the data table on the basis of the rotational direction of the inverse vector and an increment number or decrement number corresponding to the frequency.

The frequency synthesizer of the present invention is completely different from a method of committing a frequency adjusting unit (a pitch at which the frequency can be adjusted) to the frequency division of the frequency divider as in the case of the prior art. That is, (a) A sinusoidal wave signal having the output frequency of the voltage-controlled oscillation unit is subjected to orthogonal detection, and a vector rotating at the frequency (speed) corresponding to the difference from the frequency of a frequency signal used for the detection is created, (b) the frequency of the vector when the output frequency of the voltage-controlled oscillation unit is equal to a set value is calculated in advance, and (c) when the voltage-controlled oscillation unit is driven, the voltage signal corresponding to the difference between the frequency of the vector and the calculated frequency is fed back to the voltage-controlled oscillation unit, and PLL is formed so that the difference concerned is equal to zero.

Accordingly, When PLL is locked, the output frequency of the voltage-controlled oscillation unit is adjusted to a set frequency. However, by merely pre-calculating the frequency of the vector when the output frequency of the voltage-controlled oscillation unit is equal to the set value, the output frequency can set although the PLL is one-stage PLL. Therefore, the frequency can be finely set over a broad band area with little noise. For example, the voltage-controlled oscillation unit of several hundreds MHz can be set every 1 Hz or every frequency pitch lower than 1 Hz, and thus an extremely epoch-making frequency synthesize can be obtained.

In the present invention, a first constant is integrated by an integrating circuit portion and output as a control voltage of the voltage-controlled oscillation unit while the output frequency from the voltage-controlled oscillation unit is small and thus there is a large difference between the output frequency and the set frequency, thereby enhancing the output frequency. After PLL is locked, a control voltage from the feedback unit is monitored, and when the control voltage gets out of a preset range, a frequency entraining voltage is output so that the control voltage is converged into the range concerned. Therefore, the frequency entraining range is broad, and even when the frequency of the voltage-controlled oscillation unit is fluctuated or the frequency is varied due to the temperature characteristic or the like, the frequency entrainment can be performed. Therefore, a stable operation can be obtained.

Furthermore, according to a second invention, the probability that switching is carried out in the vicinity of the center value in the digital/analog converter of the feedback means for fine adjustment, so that the number of switches to be switched at the same time is reduced and glitch noise can be reduced.

BEST MODE FOR CARRYING OUT THE INVENTION

Figure 1:
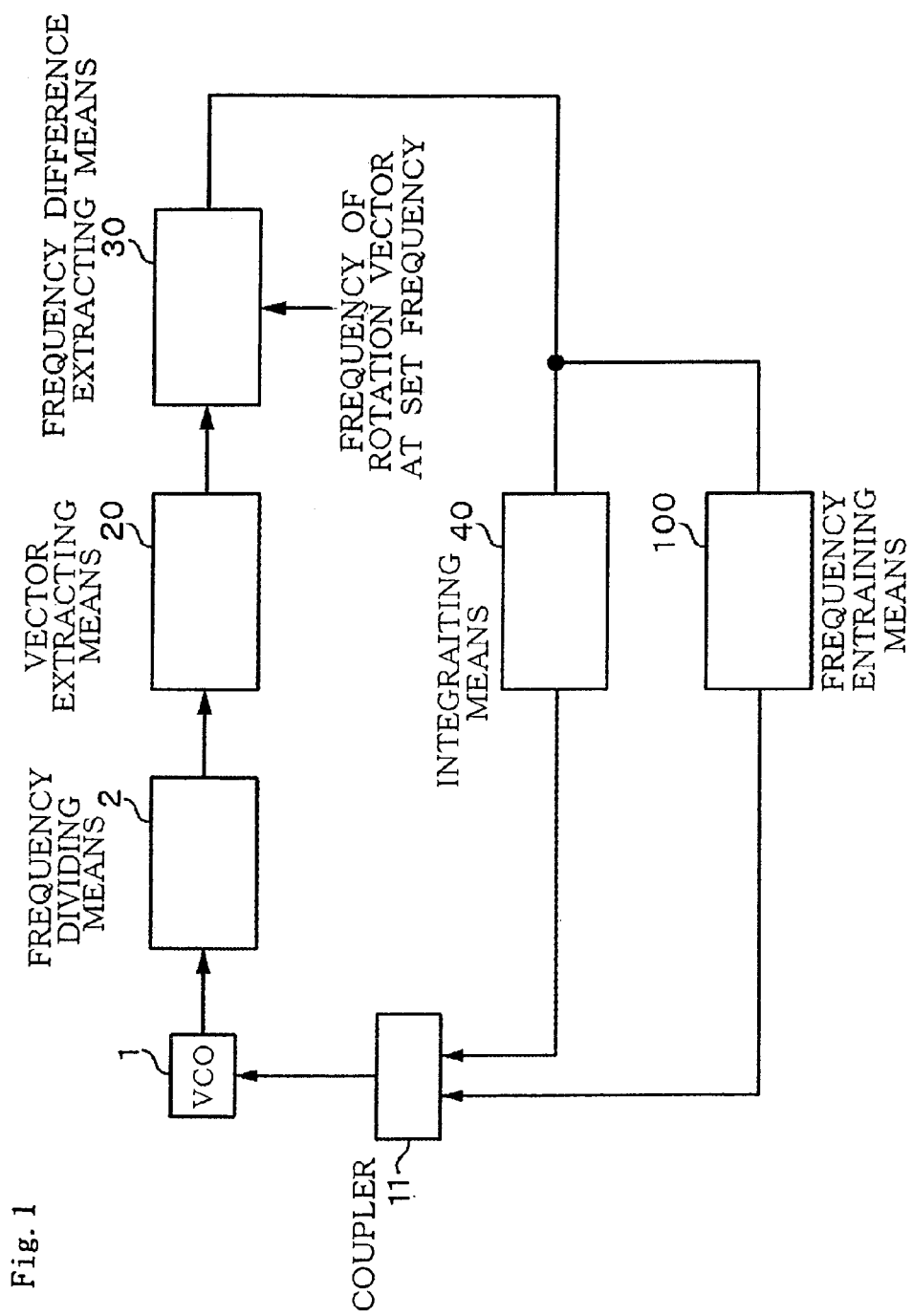
FIG. 1 is a block diagram showing the basic construction of a frequency synthesizer according to the present invention.

A frequency synthesizer according to the present invention is operated on the basis of a novel principle, and thus the operation principle of the present invention will be first briefly described with reference to FIG. 1. In FIG. 1, 1 represents a voltage-controlled oscillation unit as a voltage-controlled oscillation unit, and it outputs a frequency signal as a rectangular wave whose frequency corresponds to a supply voltage passed from a voltage output portion 11 through a first adder 12. The frequency signal from the voltage-controlled oscillator 1 is frequency-divided to 1/N (N represents an integer) by frequency dividing means 2, converted to a sinusoidal wave and converted to a digital signal. In this case, the following description is confined to only the description that a vector rotating at the frequency (speed) corresponding to the frequency of the frequency signal is extracted by vector extracting means 20.

Frequency difference extracting means at the rear stage of the vector extracting means 20 extracts the difference between the frequency of the vector and the frequency fr of the vector when the output frequency of the voltage-controlled oscillator 1 is equal to a set frequency. As a frequency difference extracting method, for example, an inverse vector rotating at the frequency fr in the opposite direction to the rotational direction of a vector to be extracted by the vector extracting means 20 when the output frequency of the voltage-controlled oscillator 1 is equal to the set frequency is created, and the vector and the inverse vector are multiplied by each other to extract the frequency difference therebetween.

The frequency of the vector may be dropped to some extent by the inverse vector, and the residual frequency difference, for example, the speed of the vector may be detected by an approximate expression. This example will be described by using a more concrete example. The adjustment of making the frequency of the vector with fr (an adjusting step of extracting the frequency difference by frequency difference extracting means 30) is divided into a rough adjustment and a fine adjustment. A frequency n·fa (n represents an integer) nearest to the frequency of the vector concerned when the output frequency of the voltage-controlled oscillator 1 is equal to a set value out of the frequencies of integer multiples of a frequency pitch fa for the rough adjustment is calculated in advance, the vector concerned is multiplied by an inverse vector which inversely rotates at the frequency n·fa, and a slow-speed vector having a frequency obtained by subtracting the frequency of the inverse vector from the frequency of the vector concerned is extracted. A frequency m·fb (m represents an integer) nearest to the difference between fr and the frequency n·fa out of integer multiples of a frequency pitch fb for the fine adjustment which is smaller than the frequency pitch fa is calculated, the difference between the frequency of the slow-speed vector and the frequency m·fb is extracted, and the difference between fr and the frequency of the vector obtained by the vector extracting means is determined.

The series of calculations described above are carried out by a parameter output portion (not shown). When the frequency difference extracting adjustment step is divided into the rough adjustment and the fine adjustment as described above, there are an advantage that an accurate frequency difference can be obtained when the frequency of the vector approaches to fr and an advantage that the processing of detecting the frequency is simple. These points will be clarified by a specific example of FIG. 2 described later.

The voltage corresponding to the frequency difference extracted by the frequency difference extracting means 30 is integrated by integrating means 40 constituting a part of the feedback means, and supplied to the input side of the voltage-controlled oscillator 1. Accordingly, the loop of FIG. 1 forms PLL, PLL is locked when the frequency difference is equal to zero, and the output frequency of the voltage-controlled oscillator 1 is locked to the set frequency.

When the frequency difference is large, there cannot be obtained a voltage enough to operate the vector extracting means 20 carrying out the digital processing, the frequency difference extracting means 30, etc., and in other words, the output frequency of the voltage-controlled oscillator 1 is small, so that the control voltage to the voltage-controlled oscillator 1 cannot be obtained. Therefore, at the operation start initial stage, the control voltage is generated from the integration circuit portion in the frequency entraining means 100 to raise the output frequency of the voltage-controlled oscillator 1. After the output frequency enters the control range of PLL, the integrating operation of the integration circuit portion in the frequency entraining means 100 is stopped.

More specifically, the control voltage is first supplied from the frequency entraining means 100, for example through the coupler 11, to the voltage-controlled oscillator 1 at the start time of the voltage-controlled oscillator 1, and the control voltage is gradually increased. When in connection with this increase, the output frequency of the voltage-controlled oscillator 1 increases and the vector extracting means 20 and the frequency difference extracting means 30 start to function, the frequency of the vector extracted by the vector extracting means 20 is increased. When this frequency enters the control range of PLL, the difference (frequency difference) between the pre-calculated frequency fr of the vector when the output frequency of the voltage-controlled oscillator 1 is equal to the set frequency and the frequency of the vector extracted in the vector extracting means 20 is reduced.

Accordingly, the increase of the control voltage from the frequency entraining means 100 is stopped, and the control voltage is set to a fixed value. In addition, the voltage corresponding to the frequency difference is integrated, and applied as a control voltage to the voltage-controlled oscillator 1. As a result, the increasing rate of the output frequency of the voltage-controlled oscillator 1 is reduced, and the increasing rate of the integration value of the frequency difference is gradually reduced. Therefore, the increasing degree of the output frequency of the voltage-controlled oscillator 1 is further relaxed. In connection with this relaxation, the increasing degree of the integration value of the voltage corresponding to the frequency difference is more relaxed. Finally, the output frequency is settled to the set frequency, and the PLL loop is locked.

However, this frequency synthesizer does not necessarily require the frequency entraining means 100 on the principle, and operates as follows when the voltage corresponding to the frequency difference is output although the frequency difference is large in the digital processing portion. That is, at the operation start time, the voltage corresponding to the frequency difference extracted by the frequency difference extracting means 30 is large, and this voltage is integrated and supplied as the control voltage of the voltage-controlled oscillator 1, so that the output frequency is increased. Thereafter, the PLL loop is locked as described above.

Actually, since the frequency division ratio may be selected in accordance with the set frequency, the frequency can be finely set over a broad frequency band by adopting an idea of the vector in spite of the one-stage PLL as described above.

Figure 2:
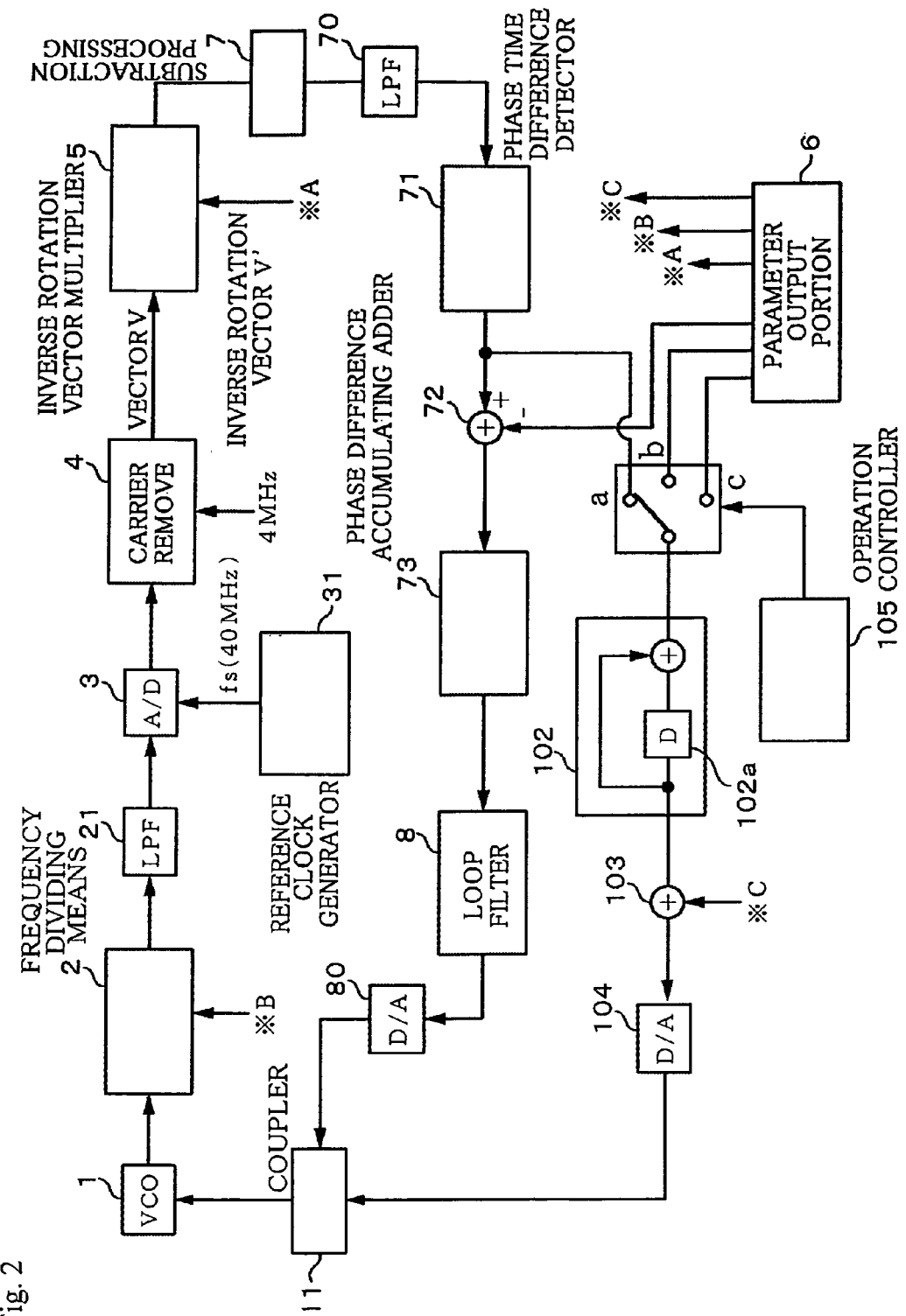
FIG. 2 is a block diagram showing an embodiment of the frequency synthesizer according to the present invention.

A specific example of the frequency synthesizer according to the present invention will be described hereunder with reference to FIG. 2 and subsequent figures.

Means provided to the rear stage of the voltage-controlled oscillator 1 will be described in order. 2 represents a frequency divider comprising a programmable counter, for example, and the frequency division ratio N (N represents an integer) of the frequency divider 2 is determined by a parameter output portion described later. A low pass filter 21 as means for converting a rectangular wave signal as a frequency signal from the frequency divider 2 to a sinusoidal signal is provided at the rear stage of the frequency divider 2.

3 represents an A/D (analog/digital) converter, and it samples the sinusoidal signal as the frequency signal from the low pass filter 21 on the basis of a clock signal from the reference clock generator 31, and outputs the sampling value as a digital signal. The reference clock generator 31 outputs a clock signal as a frequency signal in which the stability of the frequency is extremely high.

The high frequency signal which is specified by the digital signal obtained in the A/D converter 3 contains not only a fundamental wave, but also other higher harmonic waves. That is, when a sinusoidal wave having harmonic distortion is sampled, the harmonic wave component suffers a returning effect and it is assumed that the frequency of the fundamental frequency and the frequencies of the higher harmonic waves are overlapped on the frequency axis of the frequency spectrum in some cases. Therefore, it is necessary to avoid the overlap described above and afterwards extract the spectrum which accurately corresponds to the output frequency of the voltage-controlled oscillator 1.

In general, when the sinusoidal signal of the frequency f1 is sampled on the basis of a clock signal of the frequency fs, the frequency f2 as the extraction result is represented by the equation (1). Here, mod(,) represents a modulo function.

$$f2=|\mathrm{mod}(f1+fs/2,fs)-fs/2| \quad (1)$$

In this extraction result, the frequency of an n-th order higher harmonic wave of the fundamental wave frequency is represented by n × (fundamental wave frequency). Accordingly, when this is represented by f2 and substituted into the above equation (1), the frequency of the higher harmonic wave to be extracted can be calculated. By using this calculation, the frequency fc of the higher harmonic signal from the frequency divider 2 and the sampling frequency (the frequency of the clock signal) fs can be set so that the frequency of the fundamental wave and the frequency of the higher harmonic wave are not overlapped with each other. For example, the frequency division ratio N is set so that fc when the vector is stopped is equal to 36 MHz and fs is set to 40 MHz. In this case, the fundamental wave of the frequency signal specified by the output signal which is the digital signal from the A/D converter 3 becomes a sinusoidal wave of 4 MHz. If fc/fs is set to 9/10, the frequency of the fundamental wave and the frequency of the higher harmonic wave are not overlapped with each other, however, fc/fs is not limited to this value.

A carrier remove 4 is provided at the rear stage of the A/D converter 3. The carrier remove 4 corresponds to means for performing orthogonal detection on the sinusoidal signal specified by the digital signal from the A/D converter 3 by using the sinusoidal signal having a frequency of ω0t/2π (angular velocity is equal to ω0t, and extracting a vector rotating at the frequency corresponding to the difference between the frequency of the frequency signal specified by the digital signal of the A/D converter 3 and the frequency of the sinusoidal signal used for the detection, more specifically means for extracting a real number part and an imaginary number part when the vector is represented by complex notation.

Figure 3:
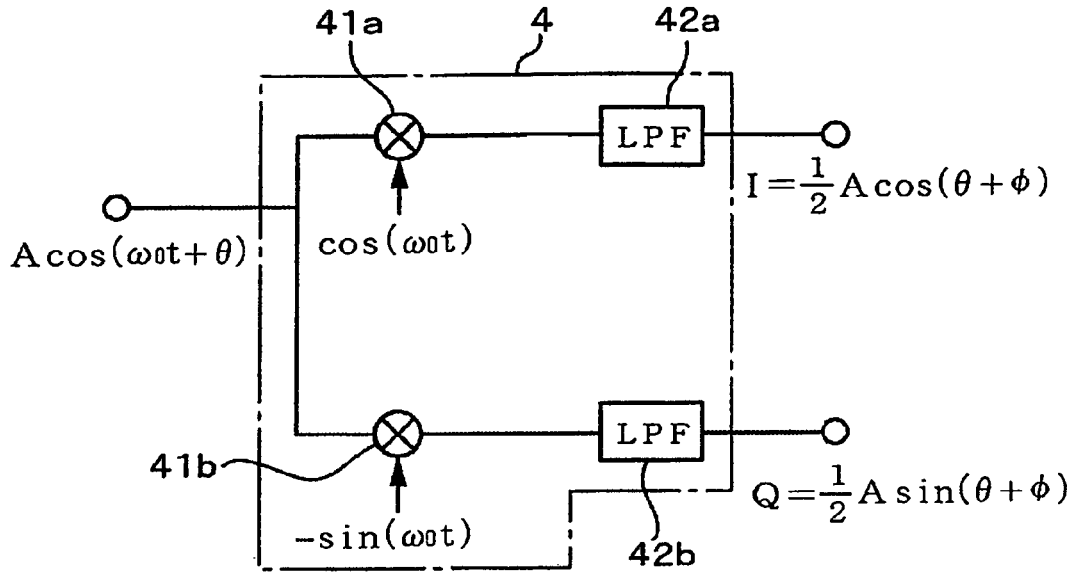
FIG. 3 is a diagram showing a carrier remove used in the embodiment.

The carrier remove 4 will be described in more detail. As shown in FIG. 3, the carrier remove 4 has a multiplier 41a for multiplying the sinusoidal signal by cos(ω0t), a multiplier 41b for multiplying the sinusoidal signal by −sin(ω0t) and low pass filters 42a and 42b provided at the rear stages of the multipliers 41a and 41b, respectively. Accordingly, when the sinusoidal signal obtained in the A/D converter 3 is set to A cos(ω0t+θ), the output of the multiplier 41a and the output of the multiplier 41b are represented by the equation (2) and the equation (3), respectively.

$$A\cos(\omega 0t+\theta)\cdot\cos(\omega 0t)=\tfrac{1}{2}\cdot A\cos\theta+\tfrac{1}{2}\{\cos(2\omega 0t)\cdot\cos\theta+\sin(2\omega 0t)\cdot\sin\theta\} \quad (2)$$

$$A\cos(\omega 0t+\theta)\cdot-\sin(\omega 0t)=\tfrac{1}{2}\cdot A\sin\theta-\tfrac{1}{2}\{\sin(2\omega 0t)\cdot\cos\theta+\cos(2\omega 0t)\cdot\sin\theta\} \quad (3)$$

Therefore, the output of the multiplier 41a and the output of the multiplier 41b are passed through the low pass filters 42a and 42b respectively, whereby the frequency signal of 2ω0t is removed. Therefore, ½·A cos θ and ½·A sin θ are extracted from the low pass filters 42a and 42b, respectively. The actual digital processing in the low pass filters 42a, 42b calculates the moving average of plural sequential, for example, six data with respect to time-sequential data output from the multipliers 41a and 41b.

As described above, when the frequency of the sinusoidal signal obtained in the A/D converter 3 is equal to the frequency of the sinusoidal signal used for the orthogonal detection, no time function is contained in the output, so that the vector obtained in the carrier remove 4 is stopped. On the other hand, when the frequency of the sinusoidal signal represented by A cos(ω0t+θ) varies, A cos(ω0t+θ) becomes A cos(ω0t+θ+ω1t). Accordingly, ½·A cos θ becomes ½·A cos (θ+ω1t), and ½·A sin θ becomes ½·A sin(θ+ω1t). That is, the outputs obtained from the low pass filters 42a, 42b correspond to the signal corresponding to the variation amount (ω1t) of the frequency of the sinusoidal signal [A cos(ω0t+θ)], that is, the real number part (I) and the imaginary number part (Q) when the vector rotating at the speed of the difference (ω1t/2π) between the frequency of the sinusoidal signal obtained in the A/D converter 3 and the frequency of the sinusoidal signal used for the orthogonal detection is represented by complex notation. In this specification, it is insignificant to discriminate frequency and angular velocity from each other, and thus both the terms are used in a mixed style in some cases.

Figure 4:
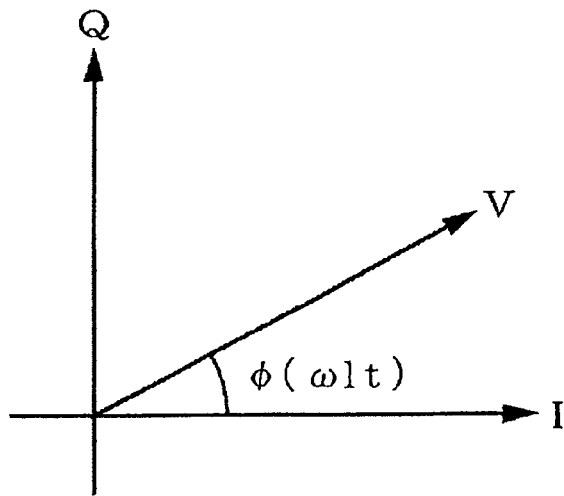
FIG. 4 is a diagram showing a vector obtained by the carrier remove.

FIG. 4 is a diagram showing a vector V, and the vector V has a length of A and a rotational speed of ω1t (=φ) (frequency is ω1t/2π). In this example, the frequency used for the orthogonal detection is equal to 4 MHz. When the frequency of the sinusoidal signal obtained in the A/D converter 3 is equal to 4 MHz, the rotational speed of the vector is equal to zero. However, when the frequency of the sinusoidal signal is deviated from 4 MHz, the vector rotates at the frequency (rotational speed) corresponding to the deviated frequency difference.

An inverse vector multiplier 5 is provided at the rear stage of the carrier remove 4. The inverse vector multiplier 5 multiplies the vector V obtained in the carrier remove 4 by an inverse vector V' created in the parameter output portion 6. By using an intuitive expression, this multiplication reduces the speed of the vector V by the amount corresponding to the speed of the inverse vector V', and in other words, the vector rotating at the difference between the frequency of the vector V and the frequency of the inverse vector V' is obtained.

The calculation in the inverse vector multiplier 5 will be described. The carrier remove 4 and the inverse vector multiplier 5 are executed by the calculation of a computer. If it is assumed that the sampling value of a vector V which is sampled at some timing in the sampling operation of the calculation concerned, for example, at an n-th sampling time is equal to I(n)+jQ(n), the sampling value of the inverse vector V' of the n-th sampling is equal to I'(n)+jQ'(n). The vector I+jQ obtained by multiplying both the vectors is equal to {I(n)+jQ(n)}×{I'(n)+jQ'(n)}. By setting this equation in order, the following equation (4) is obtained.

$$I+jQ = \{I(n)\cdot I'(n) - Q(n)\cdot Q'(n)\} + j\{I(n)\cdot Q'(n) + I'(n)\cdot Q(n)\} \quad (4)$$

Figure 5:
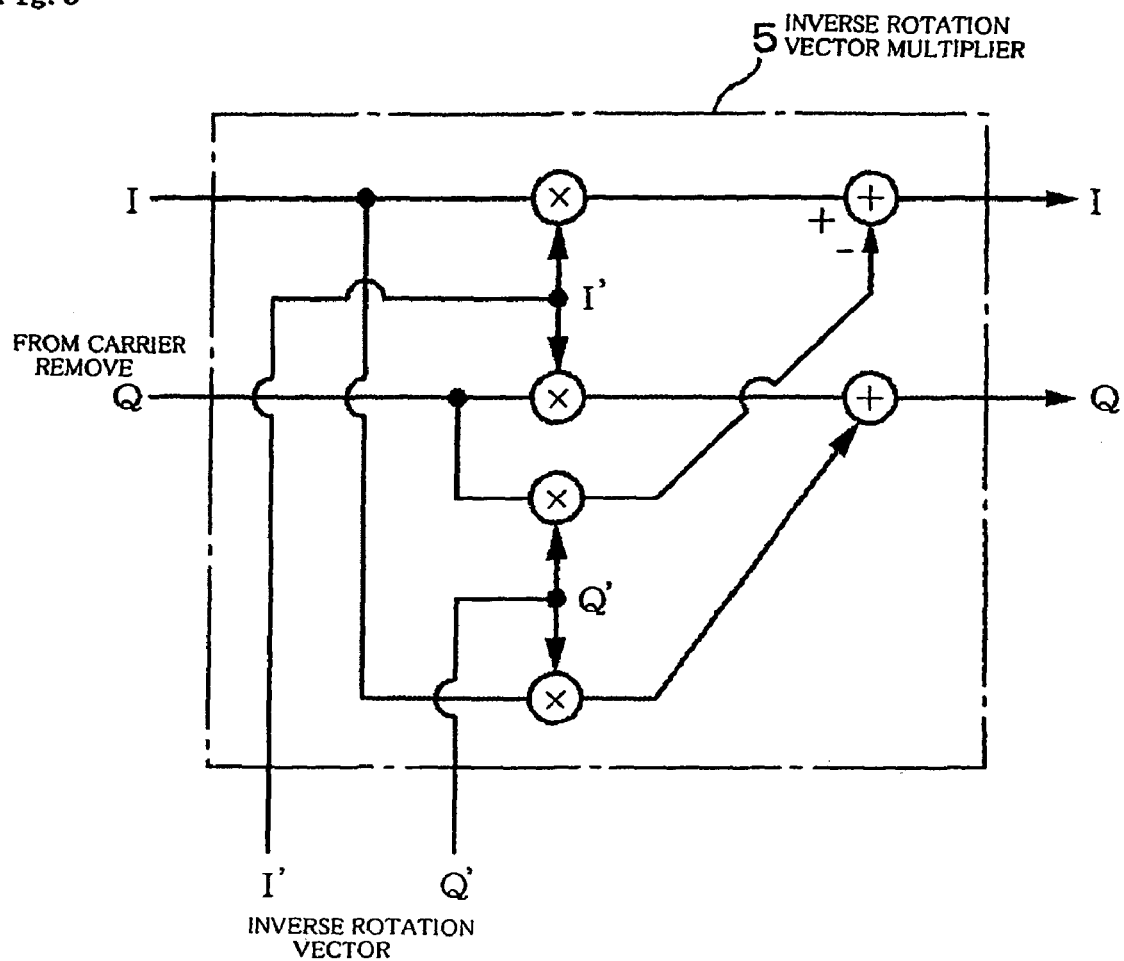
FIG. 5 is a diagram showing the construction of an inverse vector multiplier.

FIG. 5 shows the construction of the inverse vector multiplier 5, and it executes the calculation of the equation (4).

Figure 6:
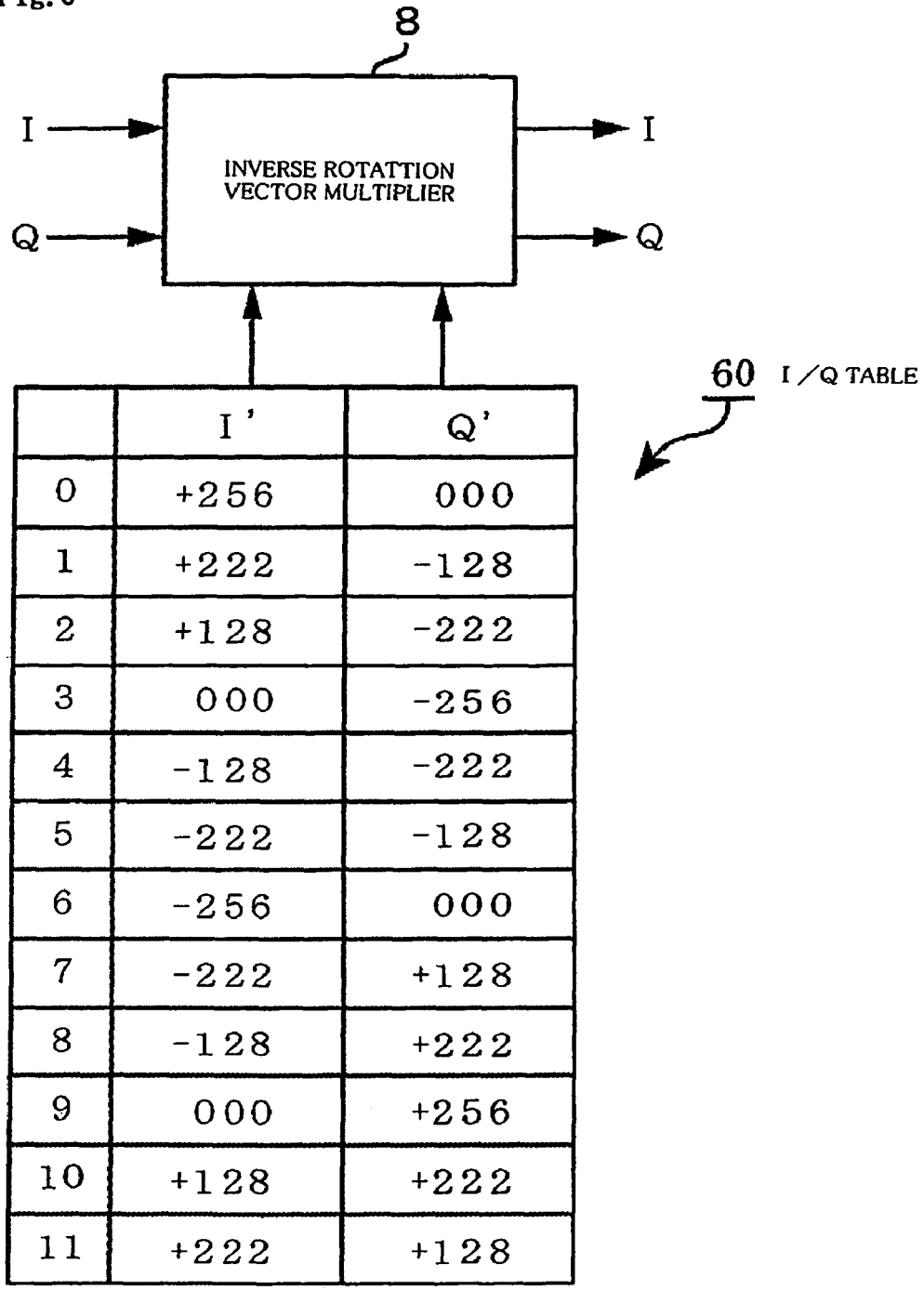
FIG. 6 is a diagram showing a data table for generating an inverse vector in a parameter generator.

Generation of the inverse vector V' actually means that the values of cos φ' and sin φ' are generated so that a vector on the complex plane is reversely rotated when the values of the real number part and the imaginary number part of the vector concerned, that is, the phase of the inverse vector V' is represented by φ'. FIG. 6 shows an I/Q table 60 in which sets of cos φ' and sin φ' of vectors are arranged in order along the rotational direction of the vectors. In this example, the parameter output portion 6 is equipped with the I/Q table 60, and it reads out the address of the I/Q table 60 on the basis of an increment number or decrement number determined in accordance with the indicated set frequency of the voltage-controlled oscillator 1 and outputs the address to the inverse vector multiplier 5. For example, addresses are successively read out from 0-th address to k-th address one by one at a clock read-out timing. When the vector V rotates at some speed, the increment number is set to 2 and addresses are read out every other address, the speed of the vector is doubled. Whether the address is read out after the increment or after the decrement can be determined by the rotational direction of the vector V extracted in the carrier remove 4. As described above the inverse vector V' which reversely rotates with respect to the vector V can be generated.

A series of specific calculations in the blocks of FIG. 2 described above will be described. When the output frequency of the voltage-controlled oscillator 1 is represented by fvco, the frequency obtained by the frequency division in the frequency divider 2 is represented by fvco/N. In the A/D converter 3, the frequency is sampled by the clock signal of fs, and thus the frequency of the frequency signal which is specified by the digital signal obtained in the A/D converter 3 is equal to fs−(fvco/N). In this example, fs is equal to 40 MHz, and thus the frequency is equal to 40 MHz−(fvco/N). Since the frequency of the sinusoidal signal (ω0t/2π) used for the detection in the carrier remove 4 is set to 4 MHz, the frequency of the vector V extracted from the carrier remove 4 is equal to 40 MHz−(fvco/N)−4 MHz.

This invention is controlled so that the frequency difference between the frequency of the vector V and the frequency fr is equal to zero when the output frequency fvco of the voltage-controlled oscillator 1 is equal to the set frequency. If (fvco/N) is equal to 36 MHz, the vector V is stopped (the frequency is equal to zero). Therefore, in this case, by setting the frequency of the inverse vector V' to zero, PLL is locked and the output frequency fvco of the voltage-controlled oscillator 1 is equal to the set frequency. However, only one point provides such a case. Actually, the vector V extracted from the carrier remove 4 rotates at some speed. Therefore, it is required to generate the inverse vector V' for stopping the vector V. However, the series of calculations are executed by software, and thus it is required from the viewpoint of the design that the memory capacity for storing data to generate the inverse vector V' is as small as possible.

From this point of view, when the set frequency of the voltage-controlled oscillator 1 is represented by fset, it is preferable that fset/N is as near to 36 MHz as possible. In this example, in the parameter output portion 6, with respect to the desired set frequency fset set by a user, an integer with which fset/N is nearest to 36 MHz is calculated, and the integer concerned is set as the frequency division ratio N of the frequency divider 2. Accordingly, the frequency of the inverse vector V' for stopping the vector extracted from the carrier remove 4 is equal to a value smaller than 4 MHz, and the data amount for generating the inverse vector V' is reduced.

Here, a specific example of the frequency is picked up. It is assumed that the set frequency fset of the voltage-controlled oscillator 1 is set to 520.0001 MHz, for example. When the frequency division ratio N is set to an integer which is nearest to fset/36 MHz, N=14. In this case, the frequency after the frequency division when the output frequency of the voltage-controlled oscillator is equal to the set frequency is equal to fset/14=37.1428642857143 MHz. As described above, when the frequency after the frequency division is equal to 36 MHz, the frequency of the frequency signal specified by the digital value obtained in the A/D converter 3 is equal to 40 MHz−36 MHz=4 MHz, and the frequency of the vector V obtained through the carrier remove 4 for executing the orthogonal detection with the sinusoidal signal of 4 MHz is equal to 4 MHz−4 MHz=0, that is, the vector V is stopped. Accordingly, the frequency signal of fset/14=37.1428642857143 MHz is digitized in the A/D converter 3, and the frequency signal thereof is input to the carrier remove 4, and the frequency of the thus-obtained vector V is equal to 37.1428642857143 MHz−36 MHz=1.1428642857143 MHz.

The calculation as described above is executed in the parameter output portion 6 by inputting the set frequency to the frequency synthesizer before the voltage-controlled oscillator 1 is operated. Furthermore, the parameter output portion 6 refers to a memory (not shown) to select a voltage value with which a frequency near to the set frequency is obtained, whereby the output voltage of the voltage output portion 11 increases to the voltage value concerned. By setting the frequency division ratio N to 14 and setting the frequency of the inverse vector V' to 1.1428642857143 MHz, the output frequency fvco of the voltage-controlled oscillator 1 increases until the frequency of the frequency signal obtained in the A/D converter 3 is equal to 1.1428642857143 MHz, and finally when the frequency of the vector V is coincident with the frequency of the inverse vector V', PLL is locked and fvco is converged to fset.

Figure 7:
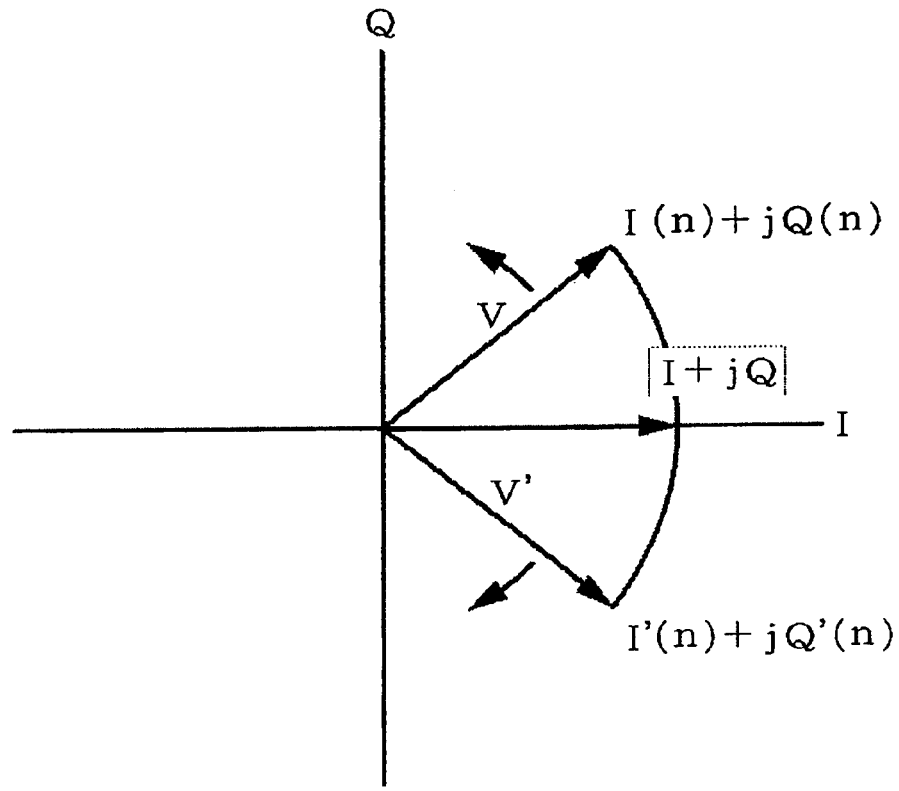
FIG. 7 is a diagram showing an aspect that the vector obtained by the carrier remove and the inverse vector are multiplied by each other by frequency difference extracting means.

FIG. 7 is an imaginary diagram showing a state that the inversely rotating processing is carried out by the inverse vector V' and the vector V is stopped.

The above operation is based on a method of stopping the vector V by relying only the inverse vector V', and in this case, the signal corresponding to the frequency of the vector obtained in the inverse vector multiplier 5 is input to a loop filter 8. However, in the construction as described above, the data amount for generating the inverse vector V' is remarkably large. Therefore, in the embodiment shown in FIG. 2, the frequency of the vector V is decelerated to some level by the inverse vector V', and the residual deceleration is committed to a phase time-difference detector 71, an adder 72 and a phase difference accumulating adder 73 at the rear stage. In other words, in the inverse vector multiplier 5, the frequency of the vector V is roughly adjusted, and at the rear-stage site, the fine adjustment of the vector V is carried out, thereby stopping the vector V.

The frequency of the inverse vector V' for the rough adjustment of the frequency of the vector V can be set at a pitch of 152.587890625 Hz, for example. The reason for this is as follows. That is, in the case where data are sampled at 40 MHz, if the number of points of the phase of the inverse vector V' is set to the 18-th power of 2, 40 MHz/the 18-th power of 2=152.587890625 Hz. In the parameter output portion 6, the minimum rough adjustment frequency (the frequency pitch fa) is equal to 152.587890625 Hz, and it is calculated how many multiples of the frequency pitch fa is nearest to the frequency of the vector V which is equal to 1142864.2857143 Hz (1.1428642857143 MHz).

An integer nearest to 1142864.2857143 Hz/152.587890625 Hz is equal to 7490, and the parameter output portion 6 calculates this integer, thereby calculating the frequency n·fa (n represents an integer)= 7490·152.587890625 Hz=1142883.30078125 Hz which is nearest to the frequency of the vector V when the output frequency of the voltage-controlled oscillator 1 is equal to the set value.

The parameter output 6 carries out the following calculation. First, the frequency to be adjusted by the inverse vector V' is subtracted from the frequency of the vector V to calculate 142864.2857143 Hz−1142883.30078125 Hz= 19.0150669664145 Hz.

Furthermore, there is calculated the frequency m·fb (m represents an integer) nearest to 19.0150669664145 Hz corresponding to the difference between the frequency n·fa and the frequency of the vector V when the output frequency of the voltage-controlled oscillator 1 is equal to the set value out of the integer multiplies of the frequency pitch fb for the fine adjustment smaller than the frequency pitch fa for the rough adjustment, in this example, the frequency pitch of 1 Hz. In this case, fb is equal to 1 Hz, and thus m is equal to 19, so that the adjustments of 19 Hz are carried out by the portions at the rear stage of the inverse vector multiplier 5. The terms of the rough adjustment and the fine adjustment used here are different from the rough adjustment and the fine adjustment in the feedback means which is an improved portion of the novel type frequency synthesizer.

Returning to FIG. 2, 7 represents a subtraction processor, represents a low pass filter, 71 represents a phase time-difference detector, 72 represents a second adder, 73 represents a phase-difference accumulating adder, 8 represents the loop filter and 80 represents a D/A (digital/analog) converter.

Figure 8:
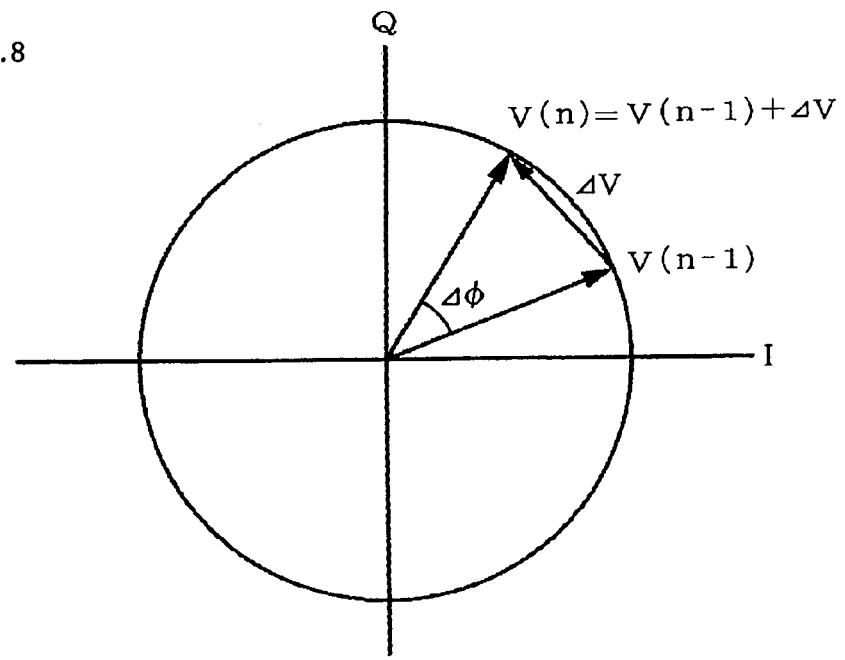
FIG. 8 is a diagram showing the phase difference between vectors which are sampled at preceding and subsequent timings.

The rotation of the vector V is decelerated by the inverse vector V', and thus the frequency (speed) of the vector V can be determined by a simple approximate expression. As shown in FIG. 8, on the complex plane, the intersection angle Δϕ between the vector V(n−1) obtained by the (n−1)-th sampling and the vector V(n)=V(n−1)+ΔV obtained by the n-th sampling, that is, th phase difference Δϕ of the vector V at both the sampling times can be regarded as having a length of ΔV if the frequency of the vector V is sufficiently smaller than the sampling frequency and θ can be regarded as being equal to sin θ.

The approximate expression to calculate ΔV will be described. First, the phase difference Δϕ is represented by the equation (5). Here, imag represents an imaginary number part, conj{V(n)} represents a conjugate vector of V(n), and K represents a constant.

$$\Delta\phi = K \cdot \mathrm{imag}[\Delta V \cdot \mathrm{conj}\{V(n)\}] \tag{5}$$

Here, when respective values of the I value (the real number part of the vector v) and the Q value (the imaginary number part of the vector V) corresponding to the n-th sampling are represented by I(n) and Q(n), Δn and conj{V(n)} are represented according to equations (6) and (7) respectively by complex notation.

$$\Delta V = \Delta I + j\Delta Q \tag{6}$$

$$\mathrm{Conj}\{V(n)\} = I(n) - jQ(n) \tag{7}$$

Here, ΔI represents I(n)−I(n−1), and ΔQ represents Q(n)−Q(n−1). By substituting the equations (6) and (7) into the equation (5) and setting the equation in order, Δϕ is represented by the equation (8).

$$\Delta\phi = \Delta Q \cdot I(n) - \Delta I \cdot Q(n) \tag{8}$$

The phase time difference detector 71 has a function of calculating Δϕ by using an approximate expression as described above. This Δϕ is the value corresponding to the frequency of the vector V which is decelerated by the inverse vector multiplier 5, and thus the phase time difference detector 71 can be regarded as means for outputting the frequency of the decelerated vector V (slow-speed vector detecting means).

If the vectors V(n−1) and V(n) are determined, various kinds of mathematical methods may be used as a method of determining the angle Δφ between the vectors, and the approximate expression of the equation (5) is merely an example. A vector V0 of {V(n)+V(n−1)}/2 which connects an original point and the middle point of a line connecting the respective terminal points of V(n) and V(n−1) may be used as a mathematical formula, and this vector V0 may be substituted into the equation (5) in place of V(n). The reason why the equation (5) as described above can be approximated resides in that V0 and ΔV are regarded as being orthogonal to each other and thus the length of ΔV can be treated as being equivalent to the imaginary number value of ΔV when V0 is regarded as the real axis.

The parameter output portion 6 determines the value of 19 Hz corresponding to the amount of the frequency fine adjustment of the vector V by the calculation. Therefore, the frequency of the vector detected in the phase time difference detector 71 and 19 Hz as the fine adjustment amount are compared with each other in the adder 72 to extract the difference between the frequency of the vector V and 19 Hz as the fine adjustment amount, and then the difference concerned is input to the phase difference accumulating adder 73. The output value from the phase difference accumulating adder 73 is input to the loop filter 8.

The present invention executes the processing of stopping the vector V as shown in FIG. 1. This processing is divided into the rough stop processing based on so-called reverse rotation and the processing of accurately stopping the decelerated slow vector V in the example of FIG. 2, and the last half processing is committed to the phase time difference detector 71 and the adder 72. The inverse vector multiplier 5, the phase time difference detector 71 and the second adder 72 correspond to the frequency difference extracting means. In this example, when the output frequency of the voltage-controlled oscillator 1 is lower than the set frequency, that is, when the frequency of the rotation vector is lower than the set frequency, the output of the phase time difference detector 71 is a negative value, and thus a multiplier 711 for multiplying this output by −1 is provided.

Figure 9:
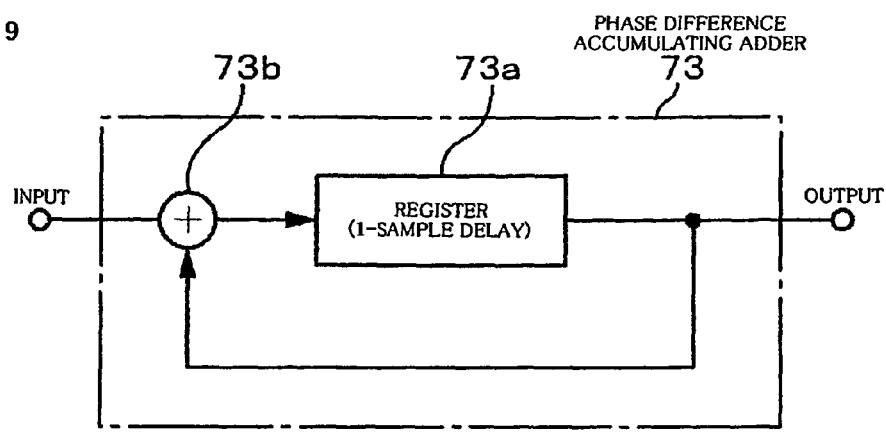
FIG. 9 is a diagram showing the construction of an accumulating adder of the phase difference in the block diagram of FIG. 1.

The phase difference accumulating adder 73 is constructed so that it holds an input value at some sampling time in a register 73*a* as shown in FIG. 9, outputs at the next sampling time a value which has been held till the next sampling time, returns the value concerned to the adder 73*b* to add the value to the input value, and inputs the addition value to the register 73*a*.

Figure 10:
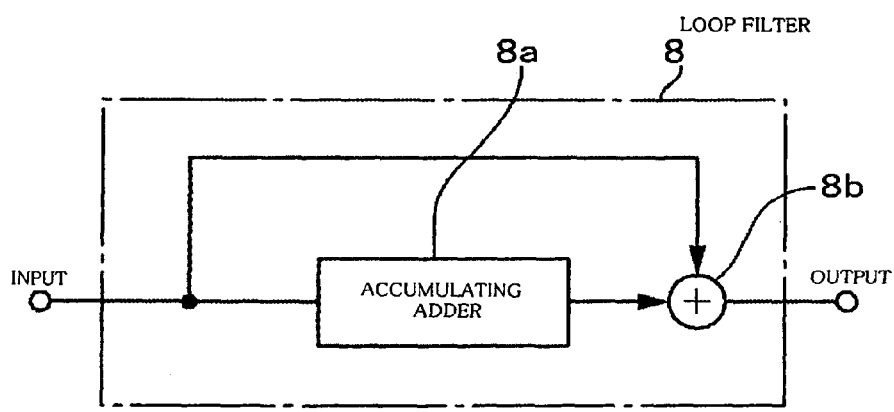
FIG. 10 is a diagram showing the construction of a loop filter in the block diagram of FIG. 1.

Furthermore, the loop filter 8 corresponds to the integrating means of FIG. 1, and it is constructed so that the input value is accumulated and added in the accumulating adder 8*a* and the input value is added to the accumulated addition value in the adder 8*b* as shown in FIG. 10. The output voltage of the loop filter 8 is converted to an analog voltage in the D/A converter 80 and added with the output voltage from the D/A converter of the frequency entraining means described later in the coupler 11, and the addition value is input as the control voltage to the voltage-controlled oscillator 1. The loop filter serves to suppress variation of the signal and stabilize the loop.

In this example, the phase-difference accumulating adder 73, the loop filter 8 and the D/A converter 80 correspond to the feedback means.

The loop passing from the voltage-controlled oscillator 1 through the frequency difference extracting means and the loop filter 8 and then returning to the voltage-controlled oscillator 1 forms PLL. Each of the sites from the A/D converter 3 to the loop filter 8 is constructed by a digital processing device such as FPGA or the like.

Here, the inventor has investigated the relationship between the detection value of the phase time difference detector 71 and the output level of the low pass filter 21, and has grasped that when the output frequency of the voltage-controlled oscillator 1 is deviated from a predetermined frequency area containing the point corresponding to a set frequency as the center, the gain of the low pas filter is dropped. Accordingly, when the frequency of the voltage-controlled oscillator 1 varies beyond this range due to the temperature characteristic or the like, the control system cannot follow this variation, and thus the frequency cannot be entrained to the set frequency. Furthermore, no control voltage is input to the voltage-controlled oscillator 1 at the driving start time of the apparatus, and thus it is necessary to raise the control voltage till the entraining range of the frequency.

Therefore, a switch portion 101, an integrating circuit portion 102, an adder 103 and a D/A converter 104 are provided as the frequency entraining unit 100. The switch portion 101 is switched to any one of contact points a, b and c. When the switch portion 101 is switched to a, the output of the phase time difference detector 71 is taken into the integrating circuit portion 102, when the switch portion 101 is switched to b, a second constant is taken into the integrating circuit portion 102 and when the switch portion 101 is switched to c, a first constant is taken into the integrating circuit portion 102. The first constant and the second constant are output from the parameter output portion 6, and the second constant (the set value of the contact point b) is set to be smaller than the first constant (the set value of the contact point c), for example.

The integrating circuit portion 102 latches a value obtained by the just preceding sampling in a latch portion 102*a*, and successively adds this value with the value obtained by the present sampling. The bit number at the digital side is smaller at the D/A converter 104 side than that at the D/A converter 80, and it outputs at a larger frequency pitch as compared with the input signal.

The switching operation of the switch portion 101 and the integration/stop of the integrating circuit portion 102 are executed by an operation controller 105. The operation controller 105 has a function of determining a frequency serving as a threshold value for controlling the operation in accordance with the set frequency, detecting the output frequency of the voltage-controlled oscillator 1 and a carrier level input to the phase time difference detector 71 and controlling the operation of the switch portion 101 and the integrating circuit portion 102 in accordance with the detection result and the threshold value.

Figure 11:
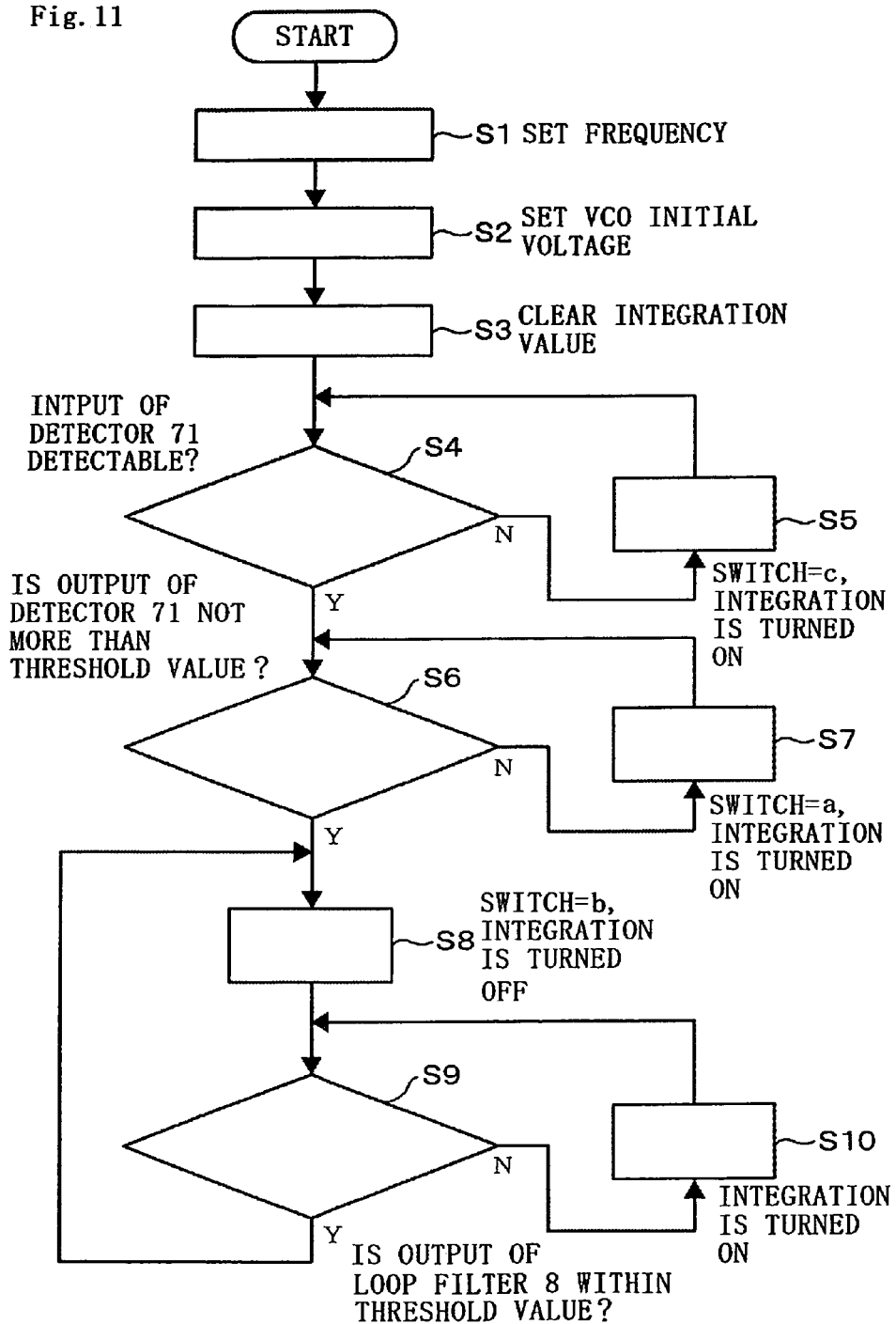
FIG. 11 is a flowchart showing the operation of the embodiment.
Figure 12:
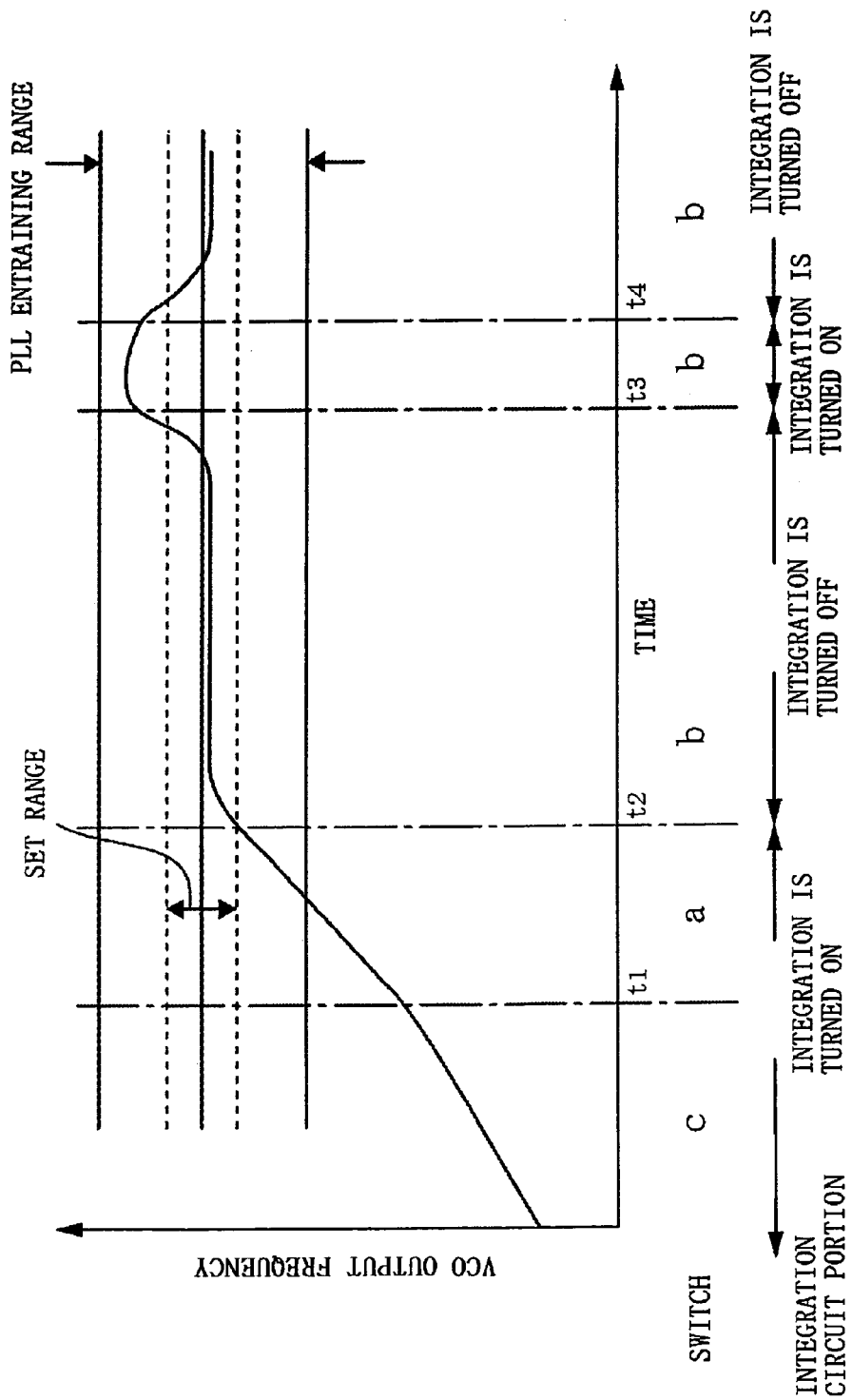
FIG. 12 is a time chart showing the operation of the embodiment.

The operation of the operation controller 105 will be clarified as described later on the action with reference to FIGS. 11 and 12, and the function thereof will be hereunder described.

A) The switch portion 101 is set to c and the integrating circuit portion 102 is turned on to integrate the first constant by the integrating circuit portion 102 while no voltage signal is obtained from the adder 72 because the output frequency from the voltage-controlled oscillator 1 is excessively small and thus the frequency difference between the set frequency and the output frequency concerned is excessively large, B) After the first constant is integrated by the integrating circuit portion 102, the control voltage of the voltage-controlled oscillator 1 is output and then the voltage signal (this signal has not yet been effective) is output from the phase time difference detector 71 because the frequency difference between the set frequency and the output frequency from the voltage-controlled oscillator 1 is reduced, the switch portion 101 is set to a and the integrating circuit portion 102 for integrating the voltage signal from the adder 72 is turned on, C) the integrating operation of the integrating circuit portion 102 is stopped after the frequency difference between the set frequency and the output frequency from the voltage-controlled oscillator 1 is further reduced and is in a range where an effective voltage signal is obtained from the phase time difference detector 71 with respect to the frequency difference concerned and the frequency difference is converged in a preset range, and D) after the integrating operation of the integrating circuit portion 102 is stopped, the second constant is integrated by the integrating circuit portion 102 after the frequency difference is in the range where the effective voltage signal is obtained from the phase time difference detector 71 and an output of the loop filter 8 is out of the preset range, and the integrating operation of the integrating circuit portion 102 is stopped after the output of the loop filter 8 is converged into a preset range.

Next, the overall operation of the embodiment shown in FIG. 2 will be described with reference to FIG. 11 and FIG. 12. As described in the above specific example, the set frequency fset of the voltage-controlled oscillator 1 is set to 520.0001 MHz, for example, and input from an input portion (not shown) (step S1 in FIG. 11). The parameter output portion 6 is equipped with a table in which the relationship between the set frequency of the voltage-controlled oscillator 1 and the supply voltage is written, and a set frequency which is nearest to 520.0001 MHz in this table is selected.

Furthermore, the respective amounts of the frequency division ratio N=14 which is an integer nearest to fset/36 MHz and the frequency of the vector V when the set frequency when each amount is divided to a rough adjustment amount and a fine adjustment amount is obtained are calculated. In this case, the rough adjustment amount of the frequency, that is, the 1142883.30078125 Hz which is the frequency of the inverse vector and the frequency 19 Hz of the vector after the reverse rotating processing which is the fine adjustment amount input to the second adder 72 are calculated.

An initial voltage which is added to the adder 103 as the frequency entraining means is calculated as a value matched with the set frequency, and further the integration value of the integrating circuit portion 102 is cleared (steps S2, S3). When a start instruction is input from the input portion, the initial voltage is added to the adder 103 to start the voltage-controlled oscillator 1. At this time point, the output frequency is low and the frequency difference from the set frequency is large. Therefore, the PLL loop is not operated, that is, no voltage signal is output from the adder 72, and the processing is shifted to step S5 through a judgment step S4, so that the switch portion 101 is set to the contact point c and the first constant is integrated in the integrating circuit portion 102.

The calculations from the carrier remove 4 to the adder 72 have been already described in detail, however, a summarized description will be made later.

As a result of the integration described above, as shown in FIG. 12, the output frequency of the voltage-controlled oscillator 1 increases, and the voltage signal is started to be output from the adder 72 at a time t1. Therefore, the processing shifts to step S6 through the judgment step S4. At this stage, the voltage signal is output from the phase time difference detector 71, however, it is not an effective value corresponding to the output frequency. When the input carrier of the phase time difference detector 71 can be detected, in step S7, the switch portion 101 is switched to a. Therefore, the voltage signal from the phase time difference detector 71 is integrated in the integrating circuit portion 102, and the integration value is applied to the coupler 11 through the D/A converter 104 and added with the voltage from the D/A converter 80. The addition voltage is supplied as the control voltage to the voltage-controlled oscillator 1.

Accordingly, the output frequency of the voltage-controlled oscillator 1 is increased, and when the output value of the phase time difference detector 71 enters a set threshold value range (first set range) (time t2), PLL is substantially locked and the processing shifts to step S8, so that the switch portion 101 is switched to b and the integrating operation of the integrating circuit portion 102 is stopped.

There is a risk that the output frequency of the voltage-controlled oscillator 1 is varied due to the temperature characteristic or the like after PLL is locked. Therefore, the operation controller 105 monitors in step S9 whether the set digital value, for example, of the D/A converter 80 is within some threshold value range (for example, a second set range corresponding to the range of ⅙ to ⅚ of the full range), and starts the integrating operation of the integrating circuit portion 102 in step S10 if the set digital value is out of the range. Accordingly, the second constant is integrated by the integrating circuit portion 102, and the second constant is supplied as a positive value or negative value. This integration value is supplied to the coupler 11 through the D/A converter 104, added with the voltage from the D/A converter 80 and supplied as a control voltage to the voltage-controlled oscillator 1. When the digital value of the D/A converter 80 is converged into the threshold value range, the integrating operation of the integration circuit portion 102 is stopped (step S9).

Next, the action containing the calculations from the carrier remove 4 to the adder 72 will be described. When a voltage is supplied to the voltage-controlled oscillator 1 at the start time of the apparatus, the frequency signal is output and the frequency thereof increases. At the initial stage, the output frequency of the voltage-controlled oscillator 1 is low. Accordingly, the frequency [40 MHz−(output frequency/N)] extracted in the A/D converter 3 is large, and thus the frequency of the vector V extracted in the carrier remove 4 is a large negative value. The carrier is attenuated in the low pass filter 71, and thus no voltage signal is output from the phase time difference detector 71. When the output frequency of the voltage-controlled oscillator 1 increases to some value, the extraction calculation of the vector V from the carrier remove 4 becomes effective, and the frequency (speed) of the vector V starts to drop.

In this description, assuming that the rotational direction of the vector V when the value of 40 MHz−(output frequency/N) is smaller than 4 MHz, that is, when the output frequency/N is larger than 36 MHz is called as a positive direction, it means that the frequency of the vector V rotating in the negative direction is lowered. At this time, the frequency of the vector V which is multiplied by the inverse rotation amount which is the output of the inverse vector multiplier 5 is also lowered. Accordingly, when the calculation becomes effective, the output of the phase time difference detector 71 is a large value because the difference between the set frequency and the output frequency has been still large, however, it is gradually lowered (the negative speed is reduced). The addition value of the second adder 72 between the output (phase difference) and the fine adjustment amount of the frequency is also reduced.

Furthermore, the output frequency of the voltage-controlled oscillator 1 increases, the frequency after the frequency division is equal to 36 MHz, and it is the timing at which the speed of the vector V extracted from the carrier remove 4 is stopped. Here, when the rough adjustment frequency is represented by ΔF(n·fa) and the fine adjustment frequency is represented by Δf(m·fb), the frequency of the vector V extracted from the carrier remove 4 has been still smaller than the adjustment amount of the frequency ΔF+Δf, and the frequency difference therebetween (the output of the second adder 72) is equal to a negative value, so that the frequency of the vector V increases. Finally, the frequency of the vector V is equal to the adjustment amount of the frequency ΔF+Δf. As described above, the output of the phase time difference detector 71 is finally converged to Δf (19 Hz in the above specific example), and the output of the second adder 72, that is, the frequency difference extracted by the frequency difference extracting means is equal to zero. Accordingly, PLL is locked, and the output frequency of the voltage-controlled oscillator 1 is locked to 520.0001 MHz which is the set frequency. In this example, the loop filter 8 is brought with the complete integral function, and thus it converges to a positive DC voltage. Furthermore, in a simulation, the time from the start of the operation of the voltage-controlled oscillator 1 till the lock of PLL is equal to about 150 msec.

According to the embodiment described above, during the period when the output frequency from the voltage-controlled oscillator 1 is small and thus there is a large difference from the set frequency, the first constant is integrated by the integrating circuit portion 102 and output as the control voltage of the voltage-controlled oscillator 1 to thereby enhance the output frequency. Furthermore, after PLL is locked, the control voltage form the loop filter 8 is monitored. When the control voltage gets out of a preset range, the second constant is integrated by the integrating circuit portion 102 and output as a frequency entraining voltage to the coupler 11 so that the control voltage is converted into the range concerned. Therefore, the frequency entraining range is broader, and when there is a dispersion in the frequency of the voltage-controlled oscillator and the frequency varies due to the temperature characteristic or the like, the frequency can be entrained and thus the stable operation can be obtained.

According to the control system of the main body of the frequency synthesizer adopted by the present invention, the following effects can be attained. The vector rotating at the speed (frequency) corresponding to the output frequency of the voltage-controlled oscillator 1 is extracted, and the difference between the frequency of the vector and the frequency of the vector when the output frequency is equal to the set frequency is extracted and fed back to the voltage-controlled oscillator 1 to construct the PLL, so that the frequency can be finely set over a broad frequency band with low noise. When the frequency difference is extracted, the speed of the vector is dropped by using the inversely rotating inverse vector and the rough frequency setting, the speed of the slow-speed vector is detected, the detection value and the pre-calculated fine adjustment amount are compared with each other to take the difference therebetween. Accordingly, the frequency of the vector can be detected by a simple calculation with suppressing the data amount as described above, and thus there can be provided the frequency synthesizer in which the memory capacity is small and the calculation load is small.

The method of determining the frequency division ratio N is not limited to the method of determining the frequency division ratio N so that when the output frequency of the voltage-controlled oscillator 1 is divided by N, it provides the frequency nearest to the difference between the frequency of the reference clock signal used in the A/D converter 3 and ω0/2π used in the vector extracting means.

Figure 13:
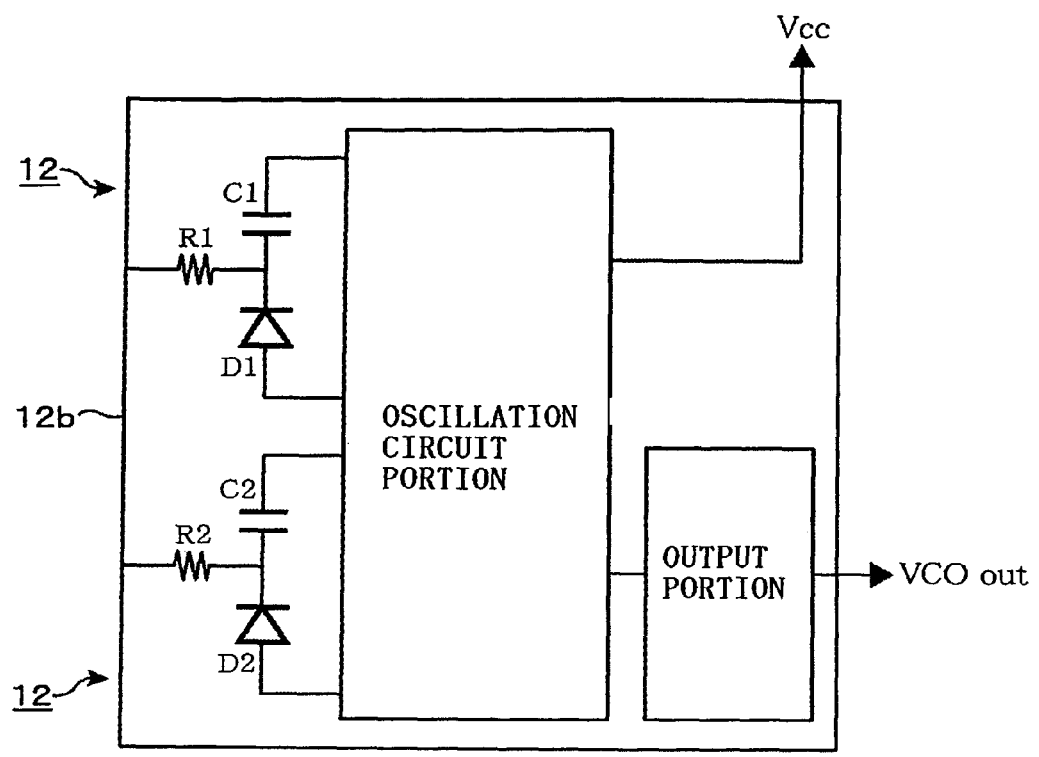
FIG. 13 is a circuit diagram showing another embodiment of the voltage-controlled oscillation unit.

Furthermore, in this invention, the added output of the respective outputs of the two D/A converters 80 and 104 is set as the control voltage of the voltage-controlled oscillator 1. In place of the provision of the coupler 11 as in the case of the embodiment described above, a two-port type voltage-controlled oscillator 12 as shown in FIG. 13 may be used, and the output of the D/A converter 80 and the output of the D/A converter 104 may be input to ports 12a and 12b, respectively.

Another embodiment of the present invention will be described. In this embodiment, an offset of several bits is applied to the D/A converter 104 in the frequency entraining means when PLL is locked after the switch portion 101 is switched to a in the embodiment described above. This point will be described in detail.

Figure 14:
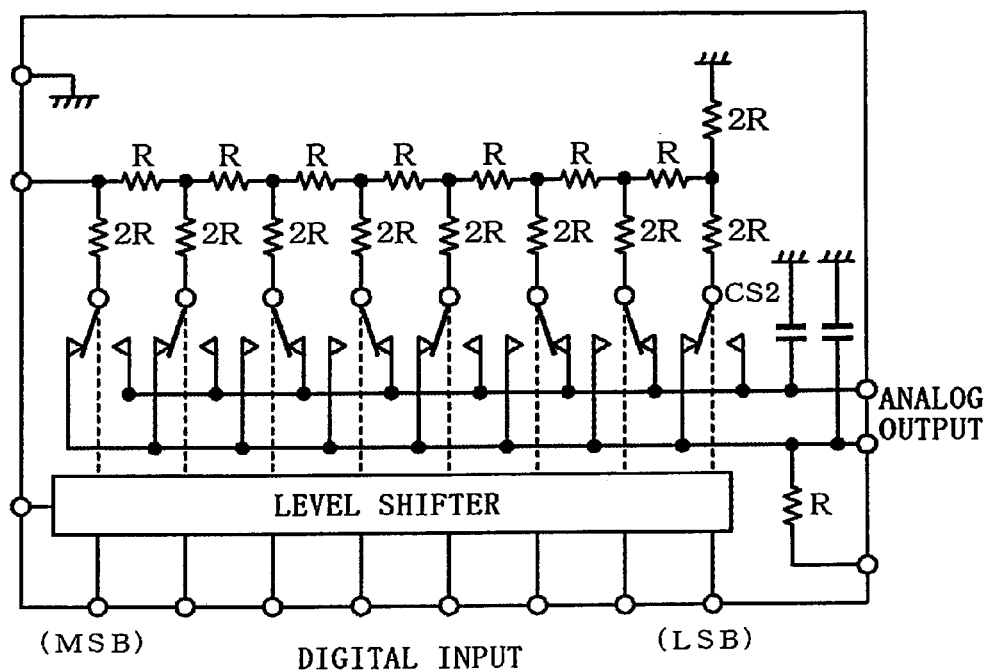
FIG. 14 is a circuit diagram showing an example of the construction of a D/A converter.

When the D/A converter 80 contained in the feedback means is a ladder resistance type as shown in FIG. 14, glitch noise occurs by switching of internal switches, and the noise amount is increased as the number of switches to be switched at the same time increases. Accordingly, when an input value of the D/A converter 80 traverses the center value of the full range, the number of switches to be switched at the same time is maximum, and the amount of occurring noise is maximum. The traverse over the center value of the full range corresponds to the switching time from "01111111" to "10000000" in the case of 8-bits shown in FIG. 14, for example. Particularly, when the rough frequency is determined by the frequency entraining means (the portions from the switch 101 to the D/A converter 104) as in the case of the above embodiment and fine gradation representation is carried out by installing PWM control into the D/A converter 80, if the set value of the D/A converter 104 of the frequency entraining means is set to the neighborhood of the center, there is a risk that the D/A converter 80 switches in the vicinity of the center value of the full range at high speed with high probability. The installation of the PWM control means that a pulse train having a duty ratio corresponding to a digital value as an input value is output every sampling timing, smoothened and output as a control voltage. When the fine gradation representation is carried out by the D/A converter, the glitch noise is relatively conspicuous because the output variation is small.

Figure 15:
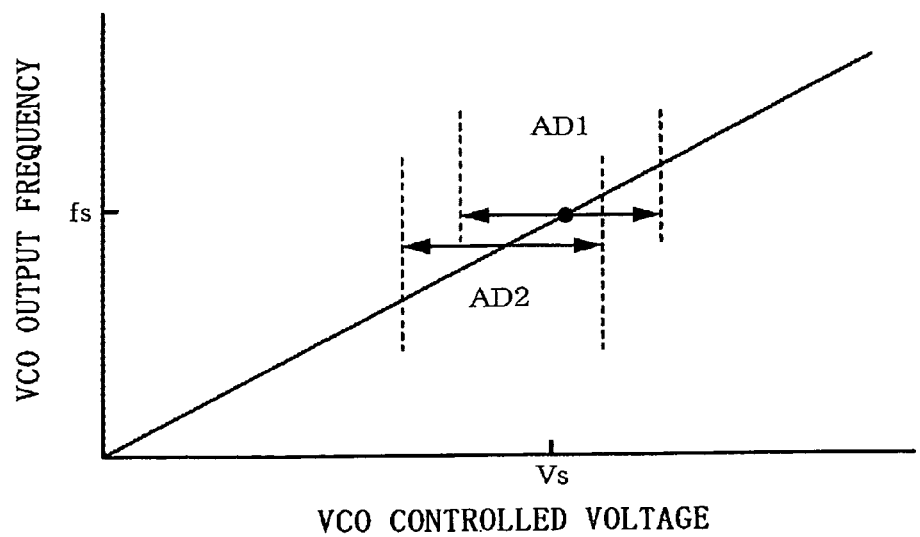
FIG. 15 is a diagram showing an aspect that the center value of the output of the D/A converter in the original feedback means is displaced by applying offset to the output of the frequency entraining means.
Figure 16:
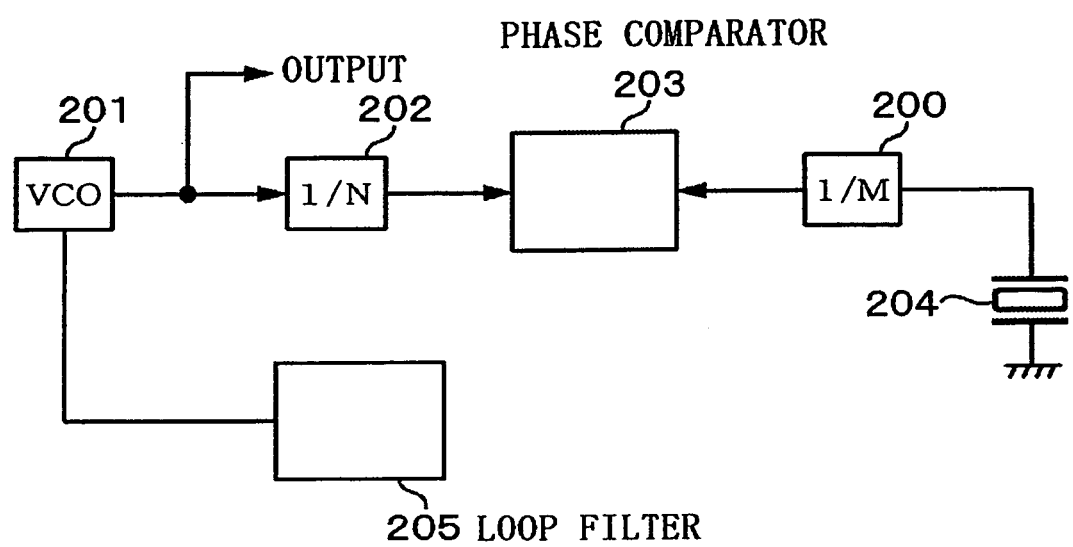
FIG. 16 is a block diagram showing the construction of a conventional frequency synthesizer.

FIG. 15 is a characteristic diagram showing the relationship between the control voltage of the voltage-controlled oscillator 1 and the output frequency, and a black circle represents the output voltage of the D/A converter 80 when PLL is locked so that the output frequency is coincident with the set frequency fs. That is, in this case, the D/A converter 80 is set so that this voltage Vs is obtained when the duty ratio of the PWM signal in the D/A converter 80 is equal to 50%. Accordingly, the center of the full range AD1 of the D/A converter 80 is set to the position of the black circle.

Therefore, according to this embodiment, with respect to the D/A converter 104 of the frequency entraining means when PLL is locked, the control voltage is set to a value which is contained in the settable control voltages and deviated from the control voltage providing the output frequency nearest to the set frequency by the amount corresponding to an integer multiple of the adjustable frequency pitch (the offset is applied). For example, when the frequency variable amount corresponding to the full range of the D/A converter 80 is equal to 4.5 MHz and the frequency variation amount per bit of the D/A converter 104 of the frequency entraining means is equal to about 750 kHz, the D/A converter 104 can be offset by the amount corresponding to ±3 bits at maximum by a simple calculation.

Accordingly, the full range of the D/A converter 80 is varied from AD1 to AD2 as shown in FIG. 15, and the output value of the D/A converter 80 when the output frequency is coincident with the set frequency fs is displaced from the center of the full range. As a result, the probability that the D/A converter 80 is switched at high speed in the neighborhood of the center value of the full range is low, and thus the glitch noise can be reduced.

The invention claimed is:

1. A frequency synthesizer comprising:
a voltage-controlled oscillation unit for oscillating a frequency signal having a frequency corresponding to a supplied voltage;
a frequency-divider for subjecting the frequency signal to 1/N (N represents an integer) frequency division in accordance with a set frequency of the voltage-controlled oscillation unit;
an analog/digital converter for sampling a sinusoidal signal having the frequency corresponding to 1/N of the output frequency of the voltage-controlled oscillation unit on the basis of a reference clock signal and outputting a sampling value of the sampled sinusoidal signal as a digital signal;
a vector extracting unit for subjecting the frequency signal corresponding to the output signal from the analog/digital converter to orthogonal detection based on a digital signal of a sinusoidal signal having a frequency of $\omega 0/2\pi$, and extracting a real number part and an imaginary number part of a rotation vector rotating at the frequency corresponding to the frequency difference between the frequency of the frequency signal concerned and $\omega 0/2\pi$ when the rotation vector concerned is represented by complex notation;
a parameter output unit for calculating the frequency of the rotation vector when the output frequency of the voltage-controlled oscillation unit is equal to a set value, and determining, on the basis of the calculated frequency, a frequency for rough adjustment set at a rough frequency pitch and a frequency for fine adjustment set at a fine frequency pitch;
a slow-speed rotation vector obtaining unit for multiplying an inverse rotation vector rotating inversely to the rotation vector by the frequency for rough adjustment calculated by the parameter output unit and obtaining a slow-speed rotation vector rotating at a differential frequency from the rotation vector;
an integrating circuit unit for integrating a value corresponding to the difference between the frequency of the slow-speed rotation vector obtained by the slow-speed rotation vector obtaining unit and the frequency for fine adjustment; and
a feedback unit for feeding back, to the voltage-controlled oscillation unit, a voltage signal corresponding to the integration value obtained by the integrating circuit unit, whereby PLL is formed by the voltage-controlled oscillation unit, the rotation vector extracting unit and the feedback unit, and when PLL is locked, an output frequency of the voltage-controlled oscillation unit is adjusted to a set frequency.

2. The frequency synthesizer according to claim 1, wherein the frequency of the slow-speed rotation vector is low to the extent that a phase $\theta$ on a complex plane that represents a rotation vector can be regarded as $\sin \theta$, and the frequency can be determined by an approximation calculation.

3. The frequency synthesizer according to claim 1, wherein the parameter output portion calculates a frequency n·fa (n represents an integer) nearest to the frequency of the rotation vector when the output frequency of the voltage-controlled oscillation unit is equal to the set value among frequencies of integer multiples of the frequency pitch fa for rough adjustment, and a frequency m·fb (m represents an integer) nearest to the difference between the frequency of the rotation vector and the frequency n·fa when the output frequency of the voltage-controlled oscillation unit is equal to the set value among integer multiplies of a frequency pitch fb for minute adjustment which is smaller than the frequency pitch fa, and the frequency difference extracting unit comprises a slow-speed rotation vector extracting unit for multiplying the rotation vector obtained in the rotation vector extracting unit by an inverse rotation vector reversely rotating at the frequency n·fa to extract a slow speed rotation vector whose frequency is obtained by subtracting the frequency of the inverse rotation vector from the frequency of the vector, a slow-speed detector for the slow-speed rotation vector which determines the frequency of the slow-speed rotation vector from the values of the real number part and the imaginary number part at each sampling time of the slow-speed rotation vector concerned, and an output unit for outputting a signal corresponding to the difference between the frequency of the slow-speed rotation vector detected in the slow-speed detector and the frequency m·fb, and wherein PLL is formed by the voltage-controlled oscillation unit, the rotation vector extracting unit and the feedback unit for feeding back the voltage signal to the voltage-controlled oscillation unit, and when PLL is locked, the output frequency of the voltage-controlled oscillation unit is adjusted to a set frequency.

4. The frequency synthesizer according to claim 3, wherein the feedback unit contains an integrating unit for integrating a signal corresponding to the difference between the frequency of the slow-speed rotation vector and the frequency m·fb.

5. The frequency synthesizer according to claim 3, wherein the frequency of the slow-speed rotation vector is low to the extent that a phase $\theta$ on a complex plane that represents a rotation vector can be regarded as $\sin \theta$, and the frequency can be determined by an approximation calculation.

6. The frequency synthesizer according to claim 1, wherein the parameter output unit calculates a value of N when a frequency value obtained by dividing the set value of the output frequency of the voltage-controlled oscillation unit by N is nearest to the difference between the frequency of the reference clock signal used in the analog/digital converter and $\omega 0/2\pi$ used in the rotation vector extracting unit, and the frequency-divider divides the frequency signal from the voltage-controlled oscillation unit by using the calculated value.

7. The frequency synthesizer according to claim 1, wherein the inverse rotation vector is generated by a data table in which a pair of a real number part and an imaginary number part for defining the position of an inverse rotation vector on a complex plane is successively arranged along a rotational direction, and an address generating unit for generating an address of the data table on the basis of an increment number or decrement number corresponding to the rotational direction and the frequency of the inverse rotation vector.

* * * * *